US011885842B1

(12) United States Patent
Pandiyan et al.

(10) Patent No.: US 11,885,842 B1
(45) Date of Patent: Jan. 30, 2024

(54) CONTROLLING ELECTRIC FIELDS IN VAPOR CELLS

(71) Applicant: Quantum Valley Ideas Laboratories, Waterloo (CA)

(72) Inventors: Rajesh Pandiyan, Kitchener (CA); Donald Booth, Kitchener (CA); Harald Kübler, Eberdingen (DE); Somayeh M.A.Mirzaee, Kitchener (CA); Hadi Amarloo, Waterloo (CA); Sanyasi Bobbara, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 17/943,796

(22) Filed: Sep. 13, 2022

(51) Int. Cl.
*G01R 29/08* (2006.01)
*G01R 33/00* (2006.01)
*C03C 27/06* (2006.01)

(52) U.S. Cl.
CPC ..... *G01R 29/0892* (2013.01); *G01R 29/0885* (2013.01); *G01R 33/0052* (2013.01); *C03C 27/06* (2013.01)

(58) Field of Classification Search
CPC ............ G01R 29/0885; G01R 29/0892; G01R 33/0052; C03C 27/06
USPC .......................................................... 324/96
See application file for complete search history.

(56) References Cited

U.S. PATENT DOCUMENTS

| 8,906,470 | B2 | 12/2014 | Overstolz et al. |
| 8,957,368 | B2 | 2/2015 | Kenny |
| 10,605,840 | B1 | 3/2020 | Amarloo et al. |
| 10,859,981 | B1 | 12/2020 | Ramirez-Serrano et al. |
| 11,054,453 | B2 | 7/2021 | Amarloo et al. |
| 11,112,298 | B2 | 9/2021 | Amarloo et al. |
| 11,150,285 | B2 | 10/2021 | Amarloo et al. |

(Continued)

FOREIGN PATENT DOCUMENTS

| WO | 2013120848 | 8/2013 |
| WO | 2019126038 | 6/2019 |

OTHER PUBLICATIONS

Violetti, Maddalena, et al. "The microloop-gap resonator: A novel miniaturized microwave cavity for double-resonance rubidium atomic clocks." IEEE Sensors Journal 14.9 (2014): 3193-3200. (Year: 2014).*

(Continued)

*Primary Examiner* — Christopher P McAndrew
(74) *Attorney, Agent, or Firm* — Henry Patent Law Firm LLC

(57) ABSTRACT

In a general aspect, a method includes interacting a beam of light with a vapor in a vapor cell. The vapor cell includes a body defined by a stack of layers that includes electrically conductive layers and electrically insulating layers. The stack of layers are bonded to each other and have first and second end layers at respective opposite ends of the body. The stack of layers also has intermediate layers between the first and second end layers that define an internal cavity of the body. A vapor is disposed in the internal cavity. The method includes applying respective voltages to one or more electrodes to alter an electric field in the internal cavity. The method also includes measuring one or both of an ion signal based on charged particles in the vapor and an optical property of the beam of light after interacting with the vapor.

30 Claims, 11 Drawing Sheets

(56) References Cited

U.S. PATENT DOCUMENTS

| | | | |
|---|---|---|---|
| 11,300,599 B1 | 4/2022 | Amarloo et al. | |
| 11,307,233 B1 | 4/2022 | Amarloo et al. | |
| 11,313,926 B1 | 4/2022 | Amarloo et al. | |
| 11,366,430 B2 | 6/2022 | Ramirez-Serrano et al. | |
| 2005/0007118 A1 | 1/2005 | Kitching et al. | |
| 2008/0203908 A1* | 8/2008 | Hasegawa | H10K 50/852 313/504 |
| 2013/0187730 A1* | 7/2013 | Nishizawa | H03H 3/08 29/854 |
| 2017/0093361 A1* | 3/2017 | Grosjean | H03H 9/02448 |
| 2018/0315529 A1 | 11/2018 | Denatale et al. | |
| 2019/0191545 A1* | 6/2019 | Motzer | H05K 1/115 |
| 2021/0114926 A1 | 4/2021 | Ramirez-Serrano et al. | |
| 2022/0018914 A1 | 1/2022 | Holloway et al. | |

OTHER PUBLICATIONS

USPTO, Non-Final Office Action dated Mar. 23, 2023, in U.S. Appl. No. 17/943,794, 30 pgs.

Violetti, et al., "The Microloop-Gap Resonator: A Novel Miniaturized Microwave Cavity for Double-Resonance Rubidium Atomic Clocks", IEEE Sensors Journal 14.9, Sep. 2014, 8 pgs.

Daschner, et al., "Fabrication and characterization of an electrically contacted vapor cell", arXiv:1204.2391v1, Apr. 11, 2012, 3 pgs.

Fan, et al., "Atom based RF electric field sensing". Journal of Physics B: Atomic, Molecular and Optical Physics, Sep. 9, 2015, 17 pgs.

Gosele, et al., "Wafer bonding for microsystems technologies", Sensors and Actuators 74, 161-168, 1999, 8 pgs.

Guan, et al., "Stacked-Ring Electrostatic Ion Guide", J. Am. Soc. Mass Spectrom., 1996, 6 pgs.

Kamiya, et al., "Origins of High Mobility and Low Operation Voltage of Amorphous Oxide TfTs: Electronic Structure, Electron Transport, Defects and Doping", Journal of Display Technology, Jul. 2009, 16 pgs.

Masteika, et al., "A Review of Hydrophilic Silicon Wafer Bonding", ECS Journal of Solid State Science and Technology, 3 (4) Q42-Q54, 2014, 13 pgs.

Sassmannshausen, et al., "High-resolution spectroscopy of Rydberg states in an ultracold cesium gas", Phy.Rev. A 87, Mar. 27, 2013, 24 pgs.

Sedlacek, et al., "Microwave electrometry with Rydberg atoms in a vapour cell using bright atomic resonances", Nature Physics 8, Nov. 2012, 6 pgs.

Suni, et al., "Effects of Plasma Activation on Hydrophilic Bonding of Si and SiO2", Journal of the Electrochemical Society, 149 (6) G348-G351, 2002, 4 pgs.

Scullion, et al., "Slotted Photonic Crystal Sensors", Sensors 2013, 13, 3675-3710, Mar. 15, 2013, 36 pgs.

WIPO, International Search Report and Written Opinion issued in Application No. PCT/CA2022/051658 dated May 16, 2023, 9 pages.

WIPO, International Search Report and Written Opinion issued in Application No. PCT/CA2022/051657 dated Jun. 2, 2023, 7 pages.

Fan, H. Q., et al., "Subwavelength microwave electric-field imaging using Rydberg atoms inside atomic vapor cells", Optics Letters, vol. 39, No. 10, May 15, 2014, pp. 3030-3033, 4 pages.

Ma, Lu, et al., "Measurement of DC and AC electric fields inside an atomic vapor cell with wall-integrated electrodes", arXiv:2106. 01968v1 [physics.atom-ph], Jun. 3, 2021, 9 pages.

Sedlacek, J., et al., "Atom Based Vector Microwave Electrometry Using Rubidium Rydberg Atoms in a Vapor Cell", arXiv:1304. 4299v1 [physics.atom-ph], Apr. 15, 2023, 5 pages.

* cited by examiner

TABLE I.   ANODIC BONDING PROCESS PARAMETERS

| | FIVE LAYER STACK - Bonding conditions (Si/G/Si/G/Si) | | | SEVEN STACK LAYER - Bonding conditions (Si/G/Si/G/Si/G/Si) | | |
|---|---|---|---|---|---|---|
| | Temperature (°C) | Voltage(V) | Time (mins) | Temperature (°C) | Voltage(V) | Time (mins) |
| Primary Bonding | 370 | 800 | 5 | 370 | 900 | 5 |
| Secondary Bonding | 370 | 800 | 2 | 370 | 900 | 6 |
| Anodically Bonded multi-stack layers | | | | | | |

FIG. 6

CONTROLLING ELECTRIC FIELDS IN VAPOR CELLS

BACKGROUND

The following description relates to controlling electric fields in vapor cells.

Vapor cells are manufactured by sealing a vapor or gas within an enclosed volume. The vapor or gas can be used as a medium to interact with electromagnetic radiation, which influences an optical transmission through the vapor or gas when illuminated by laser light. Laser beams propagating through the vapor cell may thus experience an alteration of their optical properties, which can be used represent properties of the electromagnetic radiation. In this case, the vapor cells may be suitable to serve as a sensor of electromagnetic radiation.

DESCRIPTION OF DRAWINGS

FIG. 6 is a table showing example parameters for anodically bonding stacks of glass and silicon layers.

DETAILED DESCRIPTION

Figure 1A:
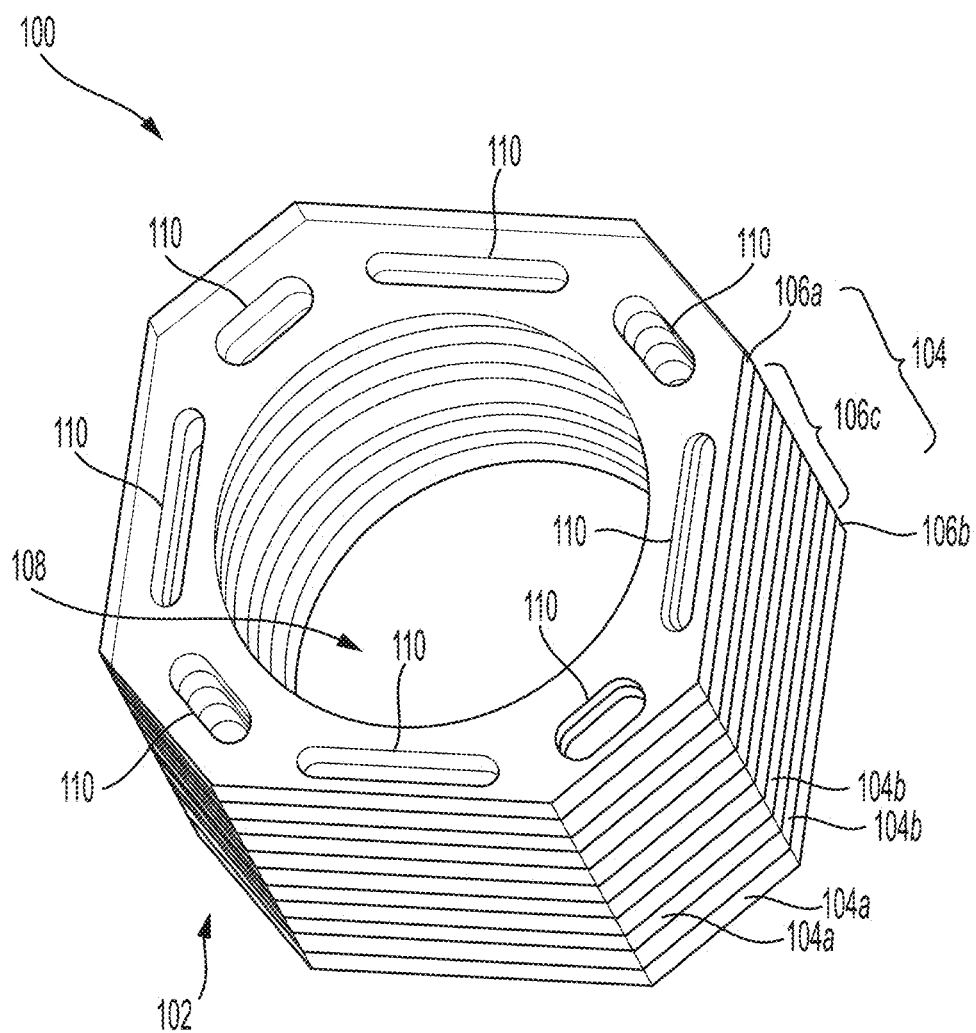
FIG. 1A is a schematic diagram of an example vapor cell having a body that is defined by a stack of layers.

In a general aspect, a vapor cell may include a body defined by a stack of layers bonded to each other, such as a laminated or bonded stack of layers. The stack of layers includes electrically conductive and electrically insulating layers that can allow control over an electric field within an internal cavity of the body. Controlling the electric field strength inside a vapor cell can be important for using high principal quantum number, n, and high angular momentum, l, states for Rydberg atom-based sensing. In other words, controlled electric fields can enable the use of Rydberg states that have large Stark shifts (e.g., shifts of Rydberg energy levels with an electric field). Structured and time-dependent electric fields may also allow the vapor cell to be used as a time-of-flight spectrometer so that ionization detection can be used for Rydberg atom-based sensing and gas sensing. Moreover, electrically conductive layers (or electrodes) at the ends of the vapor cell can be used to measure electric charges incident on them, especially for radio frequency (RF) electromagnetic fields.

The stack of layers may be configured to define an electrode structure that allows the vapor cell to establish target profiles for the electric field in the internal cavity. For example, the electrode structure can also be used to create a homogenous electric field environment for the atoms and extract unwanted charge particles in the vapor cell. Sensing of low frequency electric fields can be accomplished for applications like over-the-horizon radar, which can rely on large n states and correspondingly low frequency transitions, and the sensing of DC electric fields using Rydberg-atom Stark shifts. Gradient electric fields can also be created to broaden the bandwidth of the vapor cell, which may operate as a Rydberg atom-based sensor. Moreover, periodic electric fields combined with a gradient electric field can be used to create separate sensing bands at similar frequencies within the same vapor cell.

The stack of layers may also be configured to include electrically conductive layers that have segments to define a segmented electrode. Segmented electrodes can be implemented to change the direction of the electric field inside the vapor cell. Segmented electrodes, in particular, can also be used so that radio frequency fields can be applied to the vapor (e.g., or atoms therein) to change atomic or molecular interactions within the vapor or to apply a heterodyning field. Time dependent electric fields can be applied to modulate the energy levels of the vapor, which can aid in signal processing.

The electrically conductive layers may also have tabs extending outward from the body, thereby presenting respective surfaces that can define electrical contacts, such as for wires. Examples of the tabs are described in U.S. Pat. No. 11,313,926 entitled "Interlockable Vapor Cells." Shaping the vapor cells in three dimensions is possible while the electrodes are used inside the vapor cell. In variations where the vapor is defined by Rydberg atoms, it may be possible to actively control the electric field inside the vapor cell using a spectroscopic signal obtained from the atoms. Other advantages are possible since the electric field strength and its spatial dependence add an additional dimension to a Rydberg atom-based vapor cell sensor.

In some applications of Rydberg atom-based sensing, like over-the-horizon radar and continuously tunable sensors, it may be advantageous to control the DC electric field environment at the position of the atoms used for sensing. Rydberg atoms can exhibit large Stark shifts, particularly for high electron orbital angular momentum, l, quantum states, so called hydrogenic states. Hydrogenic states may shift linearly in proportion to an electric field and can be highly polarizable. Additionally, for sensing the long wavelengths associated with over-the-horizon radar, it can be useful to prepare high principal quantum number, n, states capable of coupling the target electromagnetic field to energetically nearby states, e.g., low energy difference states on the order of tens of MHz. The Stark shifts get stronger as the principal quantum number increases, proportional to $n^7$. The electronic orbital increases in size making the Rydberg electron more sensitive to external electric fields. Having more precise control over an electric field inside the vapor cell can be beneficial in such cases.

Controlling the electric field in the internal cavity, e.g., at the position of the atoms, can mitigate negative effects during measurement or sensing. However, controlled electric fields inside the vapor cell can also be used to detect Rydberg atom states, and electrodes (or electrically conductive layers) can be designed to detect ions in the vapor cell. The windows of a vapor cell (e.g., the end layers in the stack of layers) can serve as electrodes for reading out charged particles incident on them, such as via induced currents that pass through the vapor cell. The controlled electric fields can also be used to ionize Rydberg atoms and create charged particles, so called field ionization, which can serve as a precise way to detect the presence of Rydberg atoms, since charges can be efficiently readout at the single particle level. Controlling the electric fields inside the vapor cell can additionally be used to control the impact energy of the particles on the electrode, which influences quantum efficiency. This quantum efficiency may represent the chance that the charged particle inside the vapor cell is converted into a current traveling through the electrode. The ionizing field can also be controlled in time by pulsing the electrodes that generate the electric field at chosen positions in the vapor cell. Field gradients and textured fields can also be useful. For example, a gradient electric field can be used to increase the bandwidth of the vapor cell sensor since the Rydberg energy levels change (e.g., shift) with electric field magnitude. A linear gradient placed across a sample of Rydberg atoms in the vapor cell can create a sensing device where atoms located in different regions of the vapor cell can be in resonance with different frequencies of a target electric field.

The vapor cell may be deployed in a wide range of applications where precise control over the electric field at one or more positions of a vapor is useful. In variations in which the vapor is based on Rydberg atoms, these applications can benefit from the large Stark shifts that Rydberg atoms experience in DC electric fields. Time dependent fields can also be used for enhancing signal detection and for manipulating Rydberg atom interactions. Moreover, in many applications it is desirable to cancel background electric fields and tailor an electric field that is applied to the vapor. In some applications, the vapor cell may be part of an atomic clock as well, such as for providing a precision spectroscopic signal for the atomic clock.

FIG. 1A presents a schematic diagram, in perspective view, of an example vapor cell 100 having a body 102 that is defined by a stack of layers 104. Individual layers in the stack 104 may correspond to a wafer, a slab, a substrate, a film, a coating, or some other type of layer. The stack of layers 104 include an arrangement of electrically conductive layers 104a and electrically insulating layers 104b that are bonded to each other, such as by a lamination process. To facilitate such bonding, the stack of layers 104 may include an adhesion layer (not shown) at one or more interfaces in the stack of layers 104. The stack of layers 104 has first and second end layers 106a, 106b at respective opposite ends of the body 102. These layers 106a, 106b are optically transparent. For example, the first and second end layers 106a, 106b may be transparent to a target radio frequency (RF) electromagnetic radiation that is sensed by the example vapor cell 100. However, the layers 106a, 106b may be transparent other frequencies of electromagnetic radiation. The stack of layers 104 also has intermediate layers 106c between the first and second end layers 106a, 106b that define an internal cavity 108 of the body 102. The internal cavity 108 extends through the body 102 between the first and second end layers 106a, 106b. A vapor or a source of the vapor is disposed in the internal cavity 108.

Figure 1B:
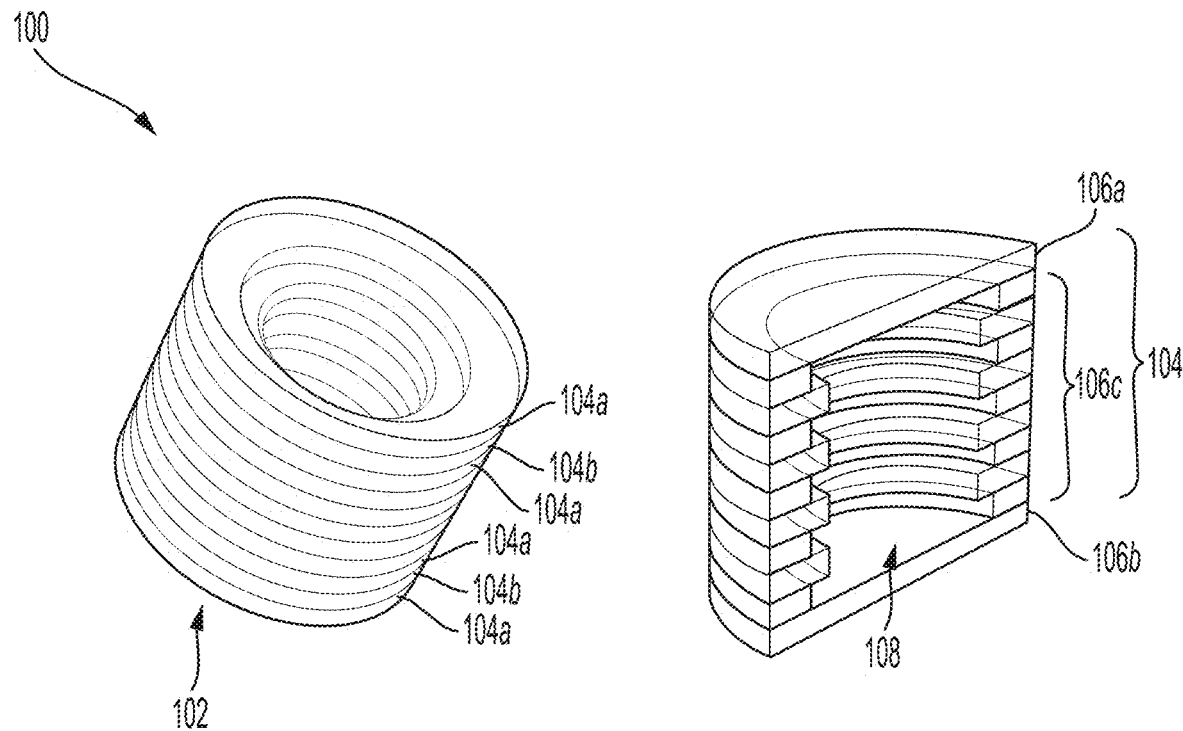
FIG. 1B is a schematic diagram, in perspective and cross-section views, of the example vapor cell, but in which the first and second end layers are electrically conductive layers.

In some variations, the stack of layers 104 is arranged to alternate in sequence between electrically conductive layers 104a and electrically insulating layers 104b. However, other arrangements are possible. In some variations, one or both of first and second end layers 106a, 106b are electrically conductive layers 104a. However, one or both these layers can, in certain cases, be electrically insulating layers 104b. For example, FIG. 1B presents a schematic diagram, in perspective and cross-section views, of the example vapor cell 100, but in which the first and second end layers 106a, 106b are electrically conductive layers. This figure shows a cylindrical geometry for an outer perimeter of the example vapor cell 100 as well as an annular ring electrode structure in the internal cavity 108. The electrodes 104a may correspond to electrically insulating substrates that are coated with an electrically conductive film, or some other structure with electrically conductive material therein. The electrically insulating layers 104b can be constructed of high resistivity silicon or silicon nitride.

Figure 1C:
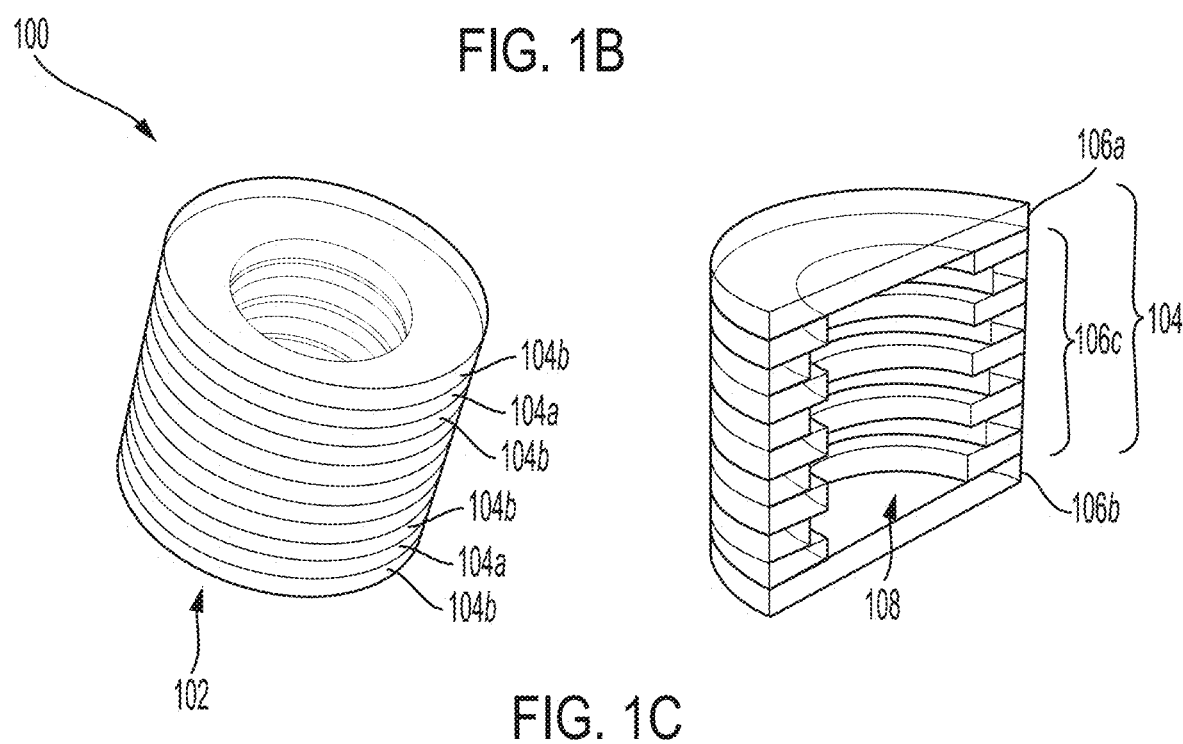
FIG. 1C is a schematic diagram, in perspective and cross-section views, of the example vapor cell, but in which the first and second end layers are electrically insulating layers.

In contrast, FIG. 1C presents a schematic diagram, in perspective and cross-section views, of the example vapor cell 100, but in which the first and second end layers 106a, 106b are electrically insulating layers 104b. This figure also shows a cylindrical geometry for the outer perimeter of the example vapor cell 100. The electrodes of the example vapor cell 100 have an annular ring structure that surrounds the internal cavity 108. The electrodes 104a may be formed of low resistance silicon (e.g., doped silicon) or some other type of conductive material (e.g., aluminum). The electrically insulating layers 104b can be constructed of glass or some other type of insulating material (e.g., sapphire, quartz, etc.). The type of bonding used to laminate the stack of layers 104 into the body 102 may be determined by the materials from which the electrodes 104a, the electrically insulating layers 104b, and coatings (if present) are formed.

In some variations, at least one of the intermediate layers 106c includes a plurality of holes 110 between the internal cavity 108 and an outer perimeter of the intermediate layer 106c. FIG. 1A depicts a specific variation in which the plurality of holes 110 extends through all intermediate layers 106c. However, other depths are possible, including partial depths through one or more intermediate layers 106c. In some variations, the one or more of the plurality of holes have different shapes. The shapes may vary, such as to create a non-uniform distribution of holes along a direction between the internal cavity 108 and the outer perimeter of the intermediate layer 106c. In some variations, the example vapor cell 100 is configured to detect a target electromagnetic radiation. In these variations, each of the plurality of holes 110 may have a largest dimension no greater than a wavelength of the target electromagnetic radiation. In this case, the plurality of holes 110 may reduce an interaction volume of the body 102 with the target electromagnetic radiation, thereby lowering an absorption and/or scattering of the target electromagnetic radiation when incident on the body 102. Such lowering may increase a detection accuracy of the example vapor cell 100.

The example vapor cell 100 of FIGS. 1A-1C may be suitable for several sensing applications, such as metrology applications. The internal cavity 108 is cylindrical in shape. Moreover, the electrically conductive layers 104a may be formed of low resistivity silicon. This type of silicon can be used as an electrode material to apply an electric field. By setting voltages on all the electrically conductive layers 104a of the example vapor cell 100, the electric field inside the example vapor cell 100 can be controlled to a high degree. In general, the greater number of electrically conductive layers 104a, the greater the degree of control over the electric field. The electrically insulating layers 104b may be formed of glass, but these layers can also be formed of other types of insulating ceramics (e.g., alumina, sapphire, quartz, etc.). In some variations, the electrically conductive layers 104a may correspond to respective coatings on the electrically insulating layers 104b. In further variations, one of more of these coatings may be patterned in a plurality of sections that that defines respective segments of a segmented electrode.

The example vapor cell 100 can be structured in three dimensions by bonding two-dimensionally structured layers to each other. The layers can also be formed with interlocking tabs or connectors to allow multiple instances of the example vapor cell 100 to be arranged into an array. In this way, different size arrays or sections of a larger, aggregate vapor cell can be constructed. In this disclosure, we use the flexibility and utility that is inherently present in the laminated vapor cell concept to build electrode structures into a vapor cell. Examples of mechanical interfaces for coupling vapor cells into an array are further described in U.S. Pat. No. 11,313,926 entitled "Interlockable Vapor Cells."

The example vapor cell 100 is configured to allow an electric field inside the internal cavity 108 to be controlled at the location of atoms or molecules used for sensing (e.g., atoms or molecules of the vapor). During operation, a voltage potential can be applied to the electrically conductive layers 104a to create an electric field inside the example vapor cell 100. If there are many electrically conductive layers 104a, then the field can be more precisely controlled and shaped. For example, in FIGS. 1A-1C, every other layer in the stack of layers 104 is conducting, thus leading to the possibility of creating a highly uniform electric field inside the internal cavity 108. The electrically conductive layers 104a of the example vapor cell 100 penetrate to the outside of the body 102 and can serve as respective electrodes of the example vapor cell 100. Moreover, each electrically conductive layer 104a includes a contact surface on an exterior side of the body 102 that can be used as an electrical contact for applying a voltage potential to the electrically-conductive layer 104a. Adjacent electrically conductive layers 104a are separated by at least one electrically insulating layer 104b so that different voltage potentials can be applied to the electrically conductive layers 104a without shorting them out.

The electrically conducting layers 104a and the electrically insulating layers 104b can have different inner and outer geometries. For example, the electrically conducting layers 104a can have a smaller radius through-hole in their center. The electrically conducting layers 104a can also have a larger outer diameter so that wires can be connected to the electrically conducting layers 104a in order to apply a voltage. Varying the shapes of individual layers in the stack 104 may be advantageous depending on an electric field profile that is desired inside the internal cavity 108. Moreover, the body 102 of can take on various shapes as is needed to create the best approximation to the ideal electric field.

Examples of coatings for glass-based electrically-insulating layers include oxide semiconductors such tin oxide, gallium oxide, zinc oxide, indium tin oxide, indium gallium zinc oxide, and forth. Materials that are conductive and transparent to radio frequency waves for Rydberg atom-based sensing can be particularly useful in forming the electrically-conductive layers 104a (e.g., coatings, films, wafers, etc.).

In some variations, bonding of the layers in the stack 104 can be accomplished by using adhesion layers, such as silicon dioxide, on top of the electrically conducting layers 104a. The adhesion layers need not cover an entire layer. The adhesion layer, can, for example, only cover the region that is bonded to hermetically seal the stack of layers 104. The adhesion layer, if electrically insulating, can also cover a portion of the electrically conducting layers 104a that penetrates into the internal cavity 108. For sensing radio frequency electromagnetic radiation, the example vapor cell 100 can incorporate larger platens and tabs for making arrays. The example vapor cell 100 can also implement segmented (e.g., quadrant, sextant, octant, etc.) electrodes in order to apply electric fields in different directions or RF electric fields to guide ions in the internal cavity 108 or modulate energy levels.

In some variations, the vapor includes a gas of Rydberg atoms (e.g., a gas of Group IIA atoms). By monitoring the spectra of Rydberg atoms in the example vapor cell 100—such as via the principles of Rydberg atom-based sensors—it may be possible to create a feedback loop that optimizes the voltages applied to the electrically conducting layers 104a according to a merit function, such as an observed Stark shift and/or spectral broadening of the Rydberg spectra. All-optical methods like electromagnetically induced transparency can be used to obtain the spectra. A field programmable gate array (FPGA) or analog circuit (e.g., an SOC) can be used for the feedback loop. An FPGA can be useful where adaptation of the feedback loop is advantageous. Ionization read-out can be used to optimize the electric fields if the first and second end layers 106a, 106b are electrically conductive and thus capable of serving as end electrodes. In these cases, charge detection is used after the ions are created from Rydberg atoms either by field ionization, collisional ionization, or black body ionization. Other physical processes may be applicable.

Figure 2A:
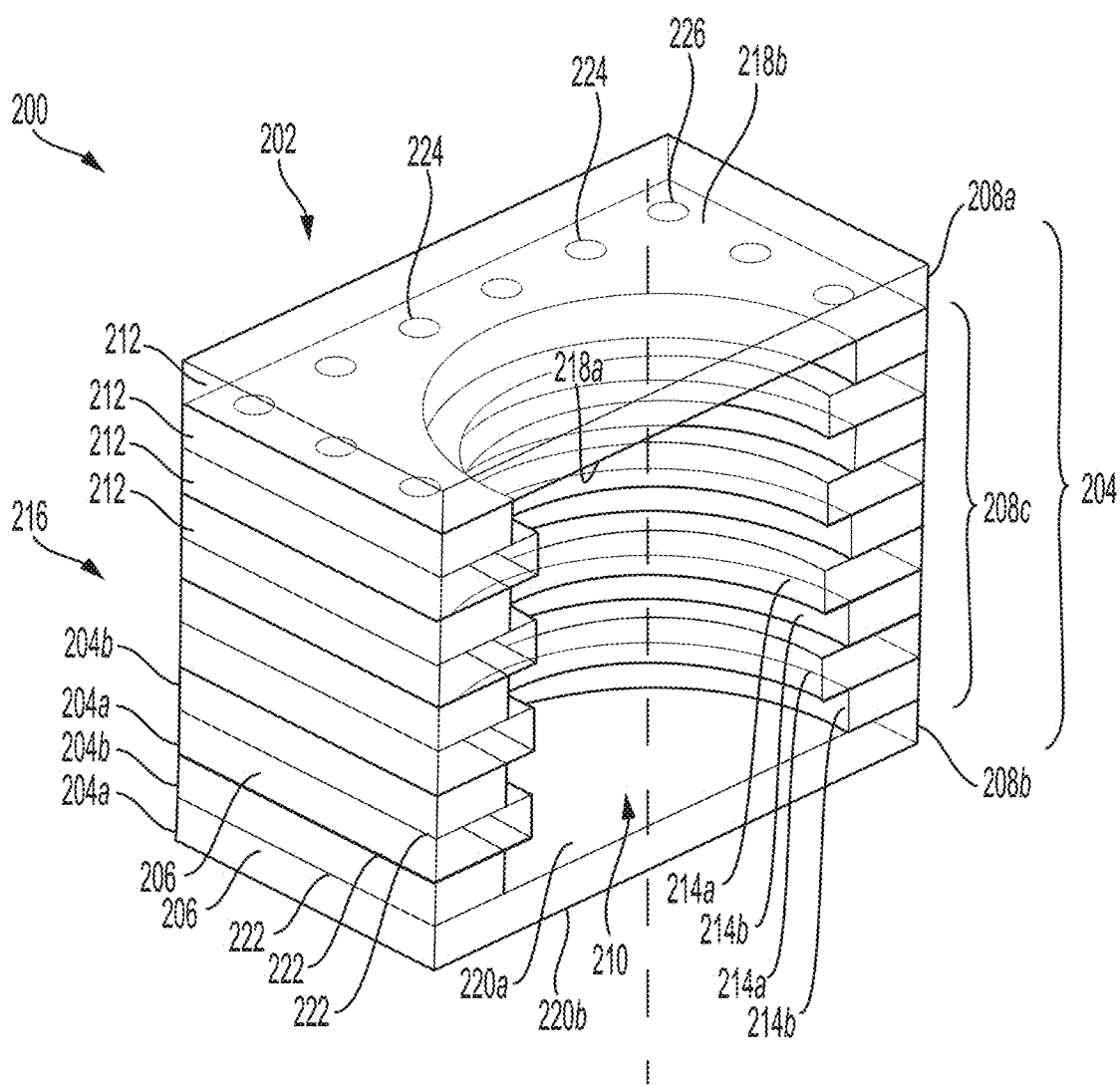
FIG. 2A is a schematic diagram, in perspective and cross-section views, of a second example vapor cell having a body that is defined by a stack of layers.

Now referring to FIG. 2A, a schematic diagram is presented, in perspective and cross-section views, of a second example vapor cell 200 having a body 202 that is defined by a stack of layers 204. The stack of layers 204 are bonded to each other and individual layers therein may correspond to a wafer, a slab, a substrate, a coating, a film, or some other type of layer. Moreover, the individual layers may be formed of a single crystal material, a polycrystalline material (e.g., a ceramic), or an amorphous material (e.g., a glass). In many variations, the layers in the stack 204 are planar in configuration (e.g., planar layers).

The stack of layers 204 includes electrically conductive layers 204a and electrically insulating layers 204b. In some variations, the electrically conductive layers 204a are formed of a material having a resistivity less than $10^3$ $\Omega$-cm. For example, one or more of the electrically conductive layers 204a may be formed of a transparent conducting oxide (e.g., $SnO_2$:F, $In_2O_3$:Sn, etc.), doped silicon (n+Si, p+Si, etc.), or a metal or metal alloy (e.g., Al, Cu, Au, Pt, Cu—Ag, Pd—Au, etc.). In some variations, the electrically insulating layers 204b are formed of a material having a resistivity greater than $10^6$ $\Omega$-cm. For example, one or more of the electrically insulating layers 204a may be formed of a glass that includes silicon oxide (e.g., vitreous silica, a borosilicate glass, and aluminosilicate glass, etc.). Other materials are possible, including ceramics (e.g., alumina, zirconia, etc.) and single crystal materials (e.g., quartz, sapphire, diamond, etc.).

The stack of layers 204 may be ordered in any arrangement in which adjacent electrically conductive layers 204a are separated by at least one electrically insulating layer 204b. Moreover, each electrically conductive layer 104a defines an electrode of the example vapor cell 200 and includes a contact surface 206 on an exterior side of the body 202. The contact surface 206 may define an electrical contact of the electrode. However, other exterior surfaces of the electrically conductive layer 104a may be used to define the electrical contact (e.g., in lieu of or in addition to contact surface 206). In some variations, at least a portion of the stack of layers 204 alternates between the electrically conductive layers 204a and electrically insulating layers 204b. FIG. 2A depicts a variation in which the entire stack of layers alternates between the electrically conductive layers 204a and electrically insulating layers 204b. However, other arrangements are possible for these layers 204a, 204b.

In many implementations, individual layers in the stack 204 are formed of materials that are transparent to a target electromagnetic radiation measured by the example vapor cell 200 (e.g., an RF electromagnetic radiation. These materials may allow the stack of layers 204 to absorb and/or scatter no more than 20% of the target electromagnetic radiation when such radiation passes through the body 202. For example, the electrically conducting layers 204b may be formed of a material having a band gap of at least 2 eV. As another example, the electrically insulating layers 204b may be formed of a dielectric material may have a high resistivity (e.g., $\rho > 10^8$ $\Omega \cdot cm$). In some cases, the materials allow the stack of layers 204 to absorb and/or scatter no more than 10% of the target electromagnetic radiation when such radiation passes through the body 202. The losses from such absorption and/or scattering may, for example, be no more than 1% in certain cases.

In some implementations, a "transparent" material is one that minimizes the absorption and/or scattering of the target electromagnetic radiation by the body 202. In these implementations, the stack of layers 204 may transmit the target electromagnetic radiation without significant distortion to an end of the body 202 or its interior. In some variations, the stack of layers 204 has a radar scattering cross-section less than its geometric cross-section. The stack of layers 204 may absorb and/or scatter less than 20% of the target electromagnetic radiation, and in some variations, less than 10%. For example, the stack of layers 204 may be formed, in whole or in part, of float-type silicon. The loss tangent of float-type silicon may be less than $10^{-3}$ for frequencies up to 400 GHz. In certain applications of the example vapor cell 200, such as antenna testing, high transparency is required to minimize reflections in a test environment and to make accurate measurements of power over more than one spatial plane or surface. In some cases, the material forming the stack of layers 204 allows a target electromagnetic field inside the example vapor cell 200 to be within a threshold percentage of the target electromagnetic field when incident thereon. In some variations, the threshold percentage is 20%. In some variations, the threshold percentage is 10%. In some variations, the threshold percentage is 1%.

The stack of layers 204 has first and second end layers 208a, 208b at respective opposite ends of the body 202. These layers 208a, 208b are optically transparent. For example, the first and second end layers 208a, 208b may be transparent to a target radio RF electromagnetic radiation that is sensed by the example vapor cell 200. However, the layers 208a, 208b may be transparent to other frequencies of electromagnetic radiation. In some variations, such as shown in FIG. 2A, the first and second end layers 208a, 208b are electrically conductive layers and define, respectively, first and second end electrodes of the example vapor cell 200. The stack of layers 204 also has intermediate layers 208c between the first and second end layers 208a, 208b that define an internal cavity 210 of the body 202. The internal cavity 210 extends through the body 202 between the first and second end layers 208a, 208b.

In some implementations, at least one electrically conductive layer 204a includes a substrate (e.g., a planar substrate) and an electrically conductive coating that covers at least part of the substrate. For example, when disposed on the substrate, the electrically conductive coating may include a first portion exposed to the interior cavity 210 and a second portion defining the contact surface 206 of the electrically conductive layer 204a. The substrate may be formed of an electrically insulating material, such as described above for the electrically insulating layers 204b. Moreover, in some instances, the at least one electrically conductive layer 204a includes an electrically insulating coating that is disposed over the electrically conductive coating and covers at least the first portion. The electrically insulating coating may be inert to a chemical reactivity of a vapor in the internal cavity 210 and thus be operable to shield the electrically conductive coating from chemical attack. Examples of the electrically insulating coating include oxide materials (e.g., $SiO_x$, $SiO_2$, $ZrO_2$, etc.). However, other materials are possible (e.g., nitride materials, carbide materials, etc.).

In some implementations, the stack of materials 204 includes one or more internal surfaces that bound the internal cavity 210. These surfaces may be associated with internal surfaces of the intermediate layers 208c as well as those of the first and second end layers 208a, 208b. In these implementations, at least a portion of the one or more internal surfaces are covered by a coating that is chemically inert to a vapor in the internal cavity 210. The portion may, in certain cases, include all internal surfaces associated with the electrically conductive layers 204a. The coating may be formed of a material similar to that described above in relation to the electrically insulating coating (e.g., oxide materials, nitride materials, carbide materials, etc.). In some variations, the coating is formed of the same material as the electrically insulating coating.

The example vapor cell 200 also includes a vapor (not shown) disposed in the internal cavity 210 defined by the intermediate layers 208c. The vapor may include constituents such as a gas of alkali-metal atoms, a noble gas, a gas of diatomic halogen molecules, a gas of organic molecules, or some combination thereof. For example, the vapor may include a gas of alkali-metal atoms (e.g., K, Rb, Cs, etc.), a noble gas (e.g., He, Ne, Ar, Kr, etc.), or both. The presence of alkali-metal atoms in the vapor may allow the vapor to function as a gas of Rydberg atoms. In another example, the vapor may include a gas of diatomic halogen molecules (e.g., $F_2$, $Cl_2$, $Br_2$, etc.), a noble gas, or both. In yet another example, the vapor may include a gas of organic molecules (e.g., acetylene), a noble gas, or both. Other combinations for the vapor are possible, including other constituents.

In some implementations, the example vapor cell 200 includes the source of the vapor. In these implementations, the intermediate layers 208c may define a wall that encircles a first portion of the internal cavity 210. The first portion may correspond to a major volume of the internal cavity

Figure 2B:
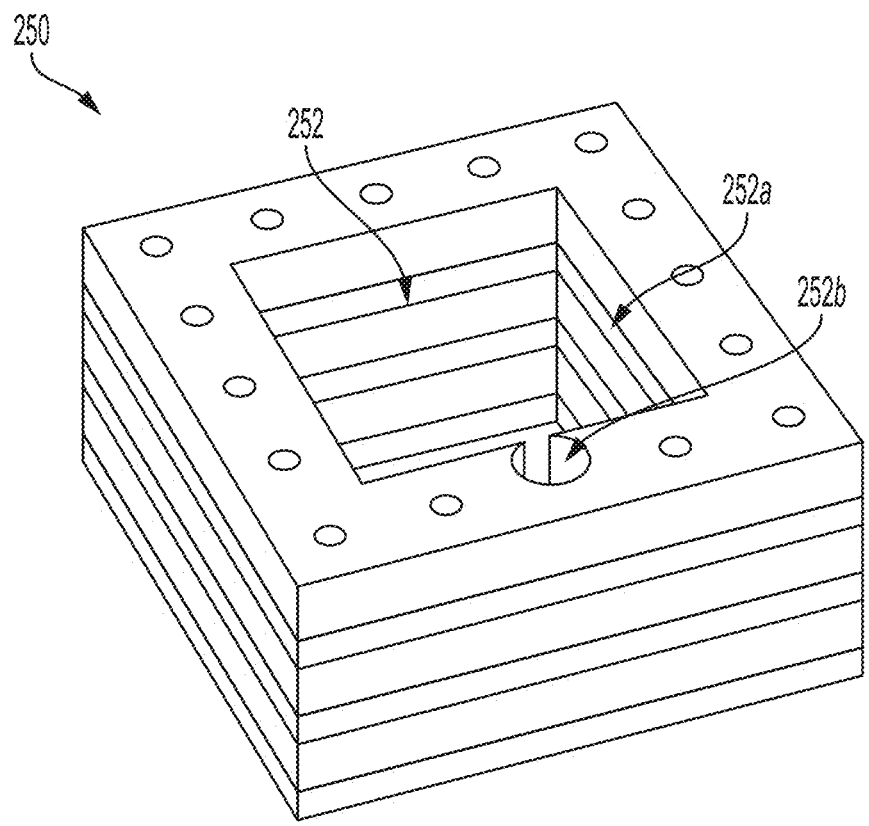
FIG. 2B is an image of a subset of intermediate layers showing an example internal cavity that has first and second portions.

210. The internal cavity 210 also includes a second portion that extends into the wall from the first portion and contains the source of the vapor. The second portion may correspond to a minor volume of the internal cavity 210 that is in fluid communication with the first portion (e.g., via an opening in the wall, via a channel in the wall, etc.). This configuration of the example vapor cell 200 may be useful to seal the source of the vapor in the example vapor cell 200 during manufacturing. Then, at a later point in time, the source of the vapor may be stimulated by a source of energy (e.g., heat from a laser beam), causing the source of the vapor to release the vapor (e.g., by melting a protective outer coating, by decomposing a chemical precursor, etc.). FIG. 2B presents an image of a subset of intermediate layers 250 showing an example internal cavity 252 that has first and second portions 252a, 252b. In some variations, the source of the vapor may function, in part, as a getter.

The stack of layers 204 may include one or more external surfaces defining an outer shape of the body 202 (e.g., an outer cuboidal shape, an outer spherical shape, an outer rectangular shape, an outer ellipsoidal shape, etc.). For example, each layer of the stack 204 may include an outer perimeter surface 212 that defines a cross-section of the outer shape at a location of the layer (e.g., a square cross-section, a circular cross-section, a rectangular cross-section, etc.). The cross-section may remain constant along the stack of layers 204, vary along the stack of layers 204, or some combination thereof. To vary the cross-section, at least two adjacent layers may have respective outer perimeter surfaces 212 that differ, relative to each other, in one or both of shape and size. FIG. 2A depicts the example vapor cell 200 as having an outer cuboidal shape with a cross-section that is constant along the stack of layers. However, other shapes are possible.

In some implementations, each intermediate layer 208c includes a through-hole that defines a portion of the internal cavity 210 through the intermediate layer 208c. In these implementations, the through-holes may be selectively configured such that the intermediate layers 208c, when stacked, define a target three-dimensional volume for the internal cavity 210 (e.g., a sphere, a frustrum, an inclined parallelepiped, etc.). The through-holes may be configured in any combination of shape, size, and location. Other characteristics are possible. In some variations, each through-hole is identical in shape and size. In these variations, the internal cavity 210 may have a cross-section that is constant through the intermediate layers 208c. In some variations, at least two adjacent intermediate layers 208c have respective through-holes that differ, relative to each other, in one or both of shape and size. In these variations, the internal cavity 210 may have a cross-section that varies, at least in part, through the intermediate layers 114.

FIG. 2A shows an example where the through-holes are circular, alternate between two diameters, and are aligned along a direction perpendicular to the stack of layers 204. As such, the through-holes define a cylindrical volume for the internal cavity 210 in which the electrically conductive layers 204a of the intermediate layers 208c protrude therein. In FIG. 2A, each intermediate layer 208c includes an inner perimeter surface 214 that defines part of the internal cavity 210. The inner perimeter surfaces 214a of the electrically conductive layers 204a are configured to allow these layers to protrude into the internal cavity 210 past the inner perimeter surfaces 214b of the electrically insulating layers 204b (e.g., past layers in the stack 204 that are adjacent the electrically conductive layers 204a). In some variations, each intermediate layer 208c includes an outer perimeter surface 212 that defines part of an exterior side 216 of the body 202. In these variations, the outer perimeter surface 212 of at least one electrically conductive layer 204a may be configured to allow the electrically conductive layer 204a to protrude from the exterior side 216 past layers in the stack 204 that are adjacent the electrically conductive layer 204a. Such protrusion may help define the outer shape of the body 202, but may also help define an electrical contact for the example vapor cell 200. The tab may, for example, include the contact surface 206 of the electrically conductive layer 204a.

Other features of the intermediate layers 208c may be used to define the target three-dimensional volume. For example, two or more intermediate layers 208c (e.g., adjacent intermediate layers) have different thicknesses. As another example, the through-hole of an intermediate layer may be defined by an internal perimeter of the intermediate layer that includes an internal perimeter surface. The internal perimeter surface may be angled, beveled, or rounded to assist in defining the target three-dimensional volume.

The target three-dimensional volume may be selected to shape a profile of electromagnetic radiation that forms in the internal cavity 210 when the electromagnetic radiation is incident on the example vapor cell 210. For example, the target three-dimensional volume may be selected to concentrate the incident electromagnetic radiation in a center of the internal cavity 210. Such shaping can increase an amplitude of the incident electromagnetic radiation in the internal cavity 210 (e.g., an amplitude of the electric field or magnetic field), making the example vapor cell 200 more sensitive to the incident electromagnetic radiation. The target three-dimensional volume may also be selected to make the profile of the incident electromagnetic radiation more uniform, such as across a desired region within the internal cavity 210. Increasing the uniformity can increase an amount of vapor that interacts with the incident electromagnetic radiation, thereby increasing a sensing region within the internal cavity 210. The target three-dimensional volume may additionally be selected to reduce a thickness of walls surrounding the internal cavity 210, thereby allowing the body 202 of the example vapor cell 200 to be more transparent to the incident electromagnetic radiation. Other benefits are possible.

The target three-dimensional volume may also be selected together with an outer shape of the body 202. Certain volume and outer shape combinations may improve the performance of the example vapor cell 200 for a target application. For example, the internal cavity 210 may have a spherical volume and the body 202 may have an outer spherical shape. This combination may allow for easier modeling of electromagnetic field profiles inside and outside of the example vapor cell 200. The ease of such modeling may be used to improve the performance of the example vapor cell 200 in metrological or other applications. Further examples of shapes for the example vapor cell 200 are described in U.S. Pat. No. 11,307,233 entitled "Vapor Cells Having Stacks of Layers Defining Target Three-Dimensional Volumes for Internal Cavities."

In some implementations, the stack of layers 204 includes sets of tabs extending outward from one or more exterior sides of the body 202. Each set of tabs may define a mechanical interface that allows the example vapor cell 200 to couple with (e.g., interlock with) another vapor cell. In some variations, the sets of tabs include one or more tabs that are an integral part of a layer. For example, an intermediate layer 208c may have inner perimeter surface disposed within an outer perimeter surface. The inner perimeter surface may define the through-hole of the intermediate layer 208c and the outer perimeter surface may define a tab extending outward from an exterior side of the intermediate layer 208c. In another example, an end layer (e.g., first end layer 208a or second end layer 208b) may have an outer perimeter surface that defines a tab extending outward from an exterior side of the end layer. In these variations, the one or more tabs may define a contact surface of an electrode if the layer corresponds to an electrically conductive layer 204a.

In some implementations, such as those that mitigate or prevent helium permeation, the stack of layers 204 includes layers formed of aluminosilicate glass or borosilicate glass (e.g., Pyrex 8). The stack of layers 204 may be coated with materials that exhibit a low helium permeation. Various optical coatings (e.g., Bragg mirrors) can also be deposited on the first and second end layers 208a, 208b to act as high reflectors and filters for optical signals used for laser preparation and signals. Waveplates can be used to control the polarization along with polarization-preserving fiber. Moreover, the example vapor cell 200 can be fiber optically coupled using GRIN (gradient index) lenses centered on an end layer of the example vapor cell 200 (e.g., the first end layer 208a or the second end layer 208b).

During operation of the example vapor cell 200, one or more optical signals (e.g., laser light) may interact with the vapor in the internal cavity 210. For example, an optical signal may enter the internal cavity 210 through the first end layer 208a and then exit the internal cavity 210 through the second end layer 208b. In another example, an optical signal may enter the internal cavity 210 through the first end layer 208a, reflect off an interior surface of the second end layer 208b, and then exit the internal cavity 210 through the second end layer 208b. If two or more optical signals are used, copropagating or counter-propagating modes of operation may be established. In the co-propagating mode, each optical signal traverses the internal cavity 210 along the same direction. In the counter-propagating mode, each optical signal traverses the internal cavity 210 along opposing directions. Examples of propagation modes for vapor cells, including examples of operating vapor cells, are described in U.S. Pat. No. 10,509,065 entitled "Imaging of Electromagnetic Fields."

To assist in propagating optical signals through the internal cavity 210, the first and second end layers 208a, 208b may include one or more optical coatings. Examples of such optical coatings include a reflective coating, an anti-reflective coating, a filter coating, a polarizing coating, and so forth. In some implementations, the first end layer 208a includes an interior surface 218a covering a first opening of the internal cavity 210 adjacent the first end layer 208a. The first end layer 208a also includes an exterior surface 218b opposite the interior surface 218a. In these implementations, one or both of the interior and exterior surfaces 218a, 218b may have an optical coating disposed thereon. Combinations of optical coatings are possible for each of the interior and exterior surfaces 218a, 218b. In some implementations, the second end layer 208b includes an interior surface 220a covering a second opening of the internal cavity 210 adjacent the second end layer 208b. The second end layer 208b also includes an exterior surface 220b opposite the interior surface. In these implementations, one or both of the interior and exterior surfaces 220a, 220b have an optical coating disposed thereon. Combinations of optical coatings are possible for each of the interior and exterior surfaces 220a, 220b.

In some implementations, the stack of layers 204 includes one or more internal surfaces that bound the internal cavity 210. In these implementations, the one or more internal surfaces may be covered, at least in part, by an anti-relaxation coating. The anti-relaxation coating may, for example, include a hydrocarbon material, such as a paraffin material. However, other materials are possible for the anti-relaxation coating.

The stack of layers 204 may include interfaces 222 between adjacent layers of the stack. In some implementations, an interface 222 between a pair of adjacent layers in the stack 204 includes a direct bond between the pair. In some implementations, an interface 222 between a pair of adjacent layers in the stack 204 includes an adhesion layer. The adhesion layer may assist in bonding the pair of adjacent layers to each other. In some variations, the adhesion layer includes silicon oxide. For example, the stack of layers 204 may alternate between layers formed of silicon and layers formed of borosilicate glass. An adhesion layer of silicon oxide (e.g., $SiO_2$, $SiO_x$, etc.) may be present at one or more interfaces 222 to facilitate the bonding of the stack of layers 204 to each other during manufacture. The adhesion layer may be formed on one or both sides of each layer of silicon to define a bonding surface that can form siloxane bonds with the layers of borosilicate glass, such as through an anodic bonding process or a contact bonding process.

The stack of layers 204 may be bonded to each other using, for example, an anodic bonding process, a contact bonding process, a glass frit bonding process, or some other type of bonding process. Combinations of bonding processes are also possible. In some variations, a contact bonding process is the final bonding process that is used in bonding the layers. For example, the first end layer 208a and the intermediate layers 208c may be bonded to each other using an anodic bonding process. A contact bonding process may then be used to bond the second end layer 208b to the intermediate layers 208c, thereby hermetically sealing the vapor or the source of the vapor in the internal cavity 210. As part of the contact bonding process, the second end layer 208a may be positioned to cover an opening of the internal cavity 210 after the internal cavity 210 is filled with the vapor or contains the source of the vapor. In many instances, the internal cavity 210 is evacuated prior to receiving the vapor or the source of the vapor. Contact bonding processes are further described in U.S. Pat. No. 10,859,981 entitled "Vapor Cells Having One or More Optical Windows Bonded to a Dielectric Body."

In some implementations, such as shown in FIG. 2A, at least one of the intermediate layers 208c includes a plurality of holes 224 between the internal cavity 210 and an outer perimeter of the intermediate layer 208c. The plurality of holes 224 may extend partially through or completely through the intermediate layer 208c. In these implementations, the example vapor cell 200 may be configured to detect a target radiation and each of the plurality of holes 224 may have a largest dimension no greater than a wavelength of the target radiation. For example, the target radiation may have a wavelength of at least 0.3 mm and each of the plurality of holes 224 may have a largest dimension no greater than 0.3 mm. In some implementations, one or more of the plurality of holes 224 may include a source of the vapor therein. In these embodiments, the intermediate layer 208c may define a channel (or part thereof) that fluidly couples the one or more holes 222 to the internal cavity 210.

Figure 3A:
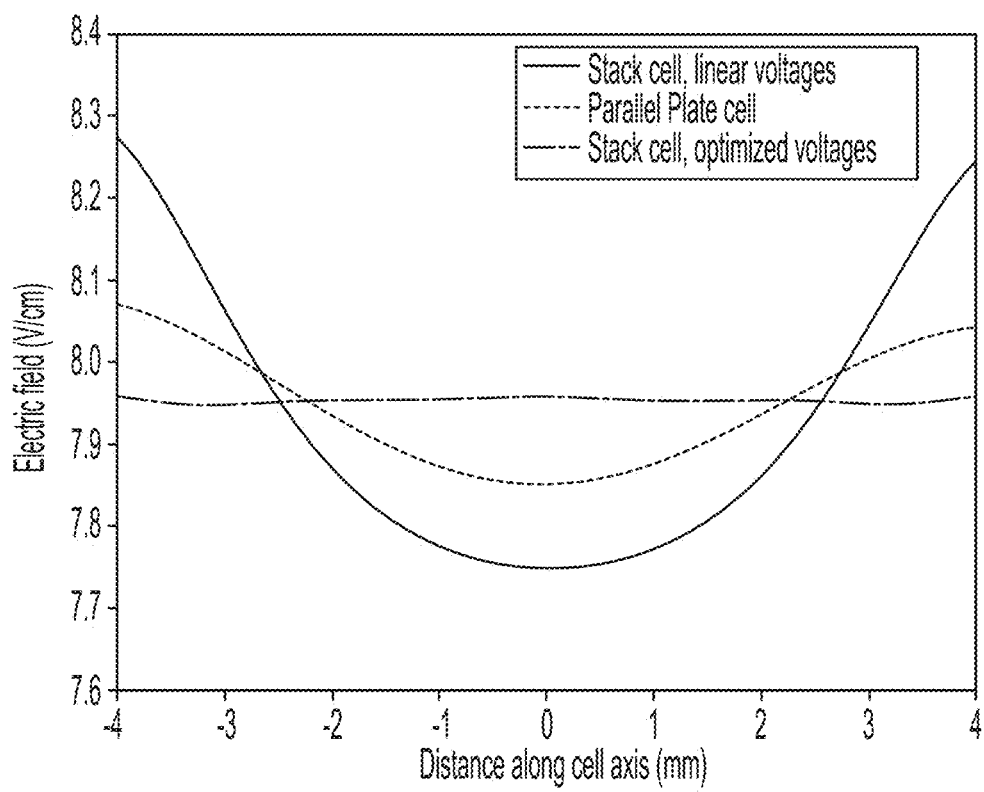
FIG. 3A is a graph of three longitudinal profiles for various respective electric fields generated by applying respective voltage profiles to electrically conductive layers of a simulated vapor cell.
Figure 3B:
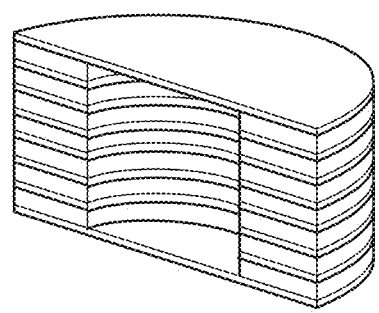
FIG. 3B is a schematic diagram, in perspective and cross-section views, of the simulated vapor cell of FIG. 3A.

In operation, respective voltages may be applied to one or more of the contact surfaces 206 of the electrically conductive layers 204a in order to control an electric field inside the internal cavity 210 and thus generate a profile for the electric field. FIG. 3A presents a graph of three longitudinal profiles for various respective electric fields generated by applying respective voltage profiles to electrically conductive layers of a simulated vapor cell. The simulated vapor cell is analogous to the example vapor cell 200 described in relation to FIG. 2A and is illustrated in FIG. 3B. The longitudinal profiles correspond to a direction parallel to a central axis of the simulated vapor cell. FIG. 3A shows that different electric field profiles are possible to achieve in a vapor cell that includes electrically conductive layers. For example, the curve represented by the line having dashes and dots shows a much more uniform electric field than is achievable by applying the potential to the end layers alone (i.e., the curve represented by the dotted). The curve represented by the solid line shows a profile that is achieved in the vapor cell by applying a linear gradient of voltages to the electrically conductive layers, thereby demonstrating a variation in the electric field that can be achieved. The length of the simulated vapor cell is 9.1 mm and the layer spacing is 1.3 mm. The electrodes (or electrically conductive layers) have a thickness of 0.3 mm. For the parallel plate simulation, the voltages on the first and second end layers are 10 V and 3 V, respectively. For the linear calculation, the applied voltages are 10 V, 9 V, 8 V, 7 V, 6 V, 5 V, 4 V and 3 V. The optimized voltages are 10 V, 9.11453 V, 8.0437 V, 7.02993 V, 5.97598 V, 4.96491 V, 3.89116 V, and 3 V.

Figure 3C:
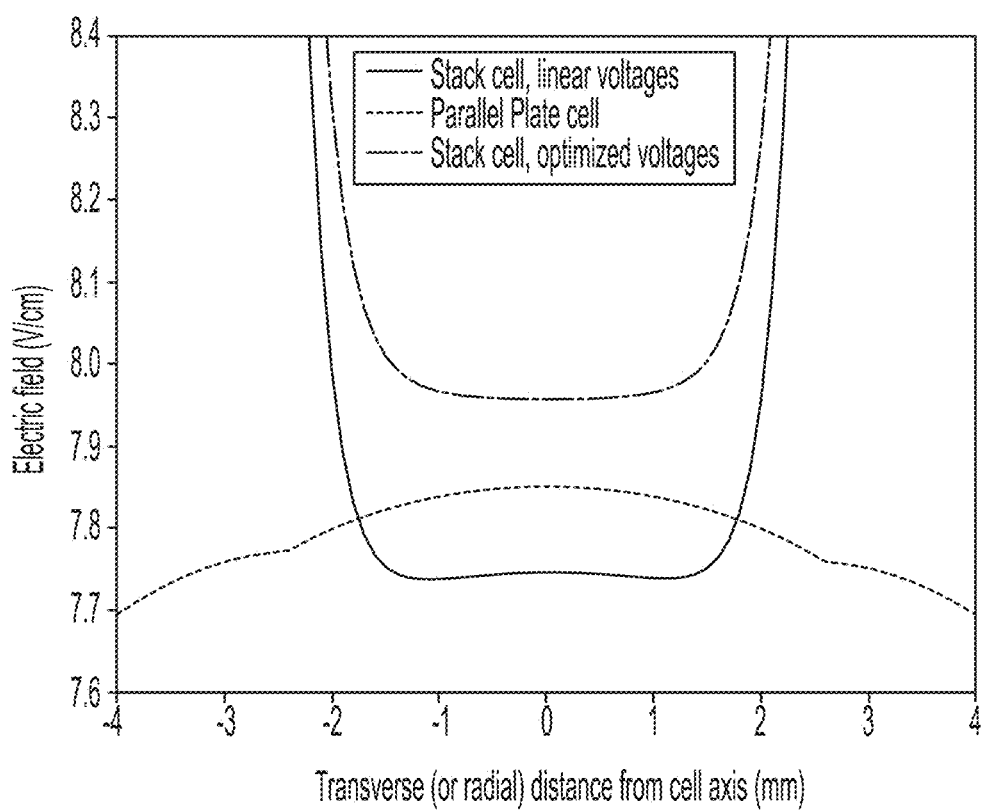
FIG. 3C is a graph of three example transverse profiles for various respective electric fields generated by the simulated vapor cell of FIG. 3B.

FIG. 3C presents a graph of three example transverse profiles for various respective electric fields generated by the simulated vapor cell of FIG. 3B. The transverse profiles correspond to a direction perpendicular to the central axis of the simulated vapor cell (e.g., a radial direction). The graph shows that the simulated vapor cell with the stacked electrodes has a more uniform electric field inside its internal cavity than a vapor cell configured with electrodes on the windows (or end layers), e.g., as a parallel plate capacitor. The graph here is shown for the center of the vapor cell, which corresponds to the zero position shown in FIG. 3A.

Figure 3D:
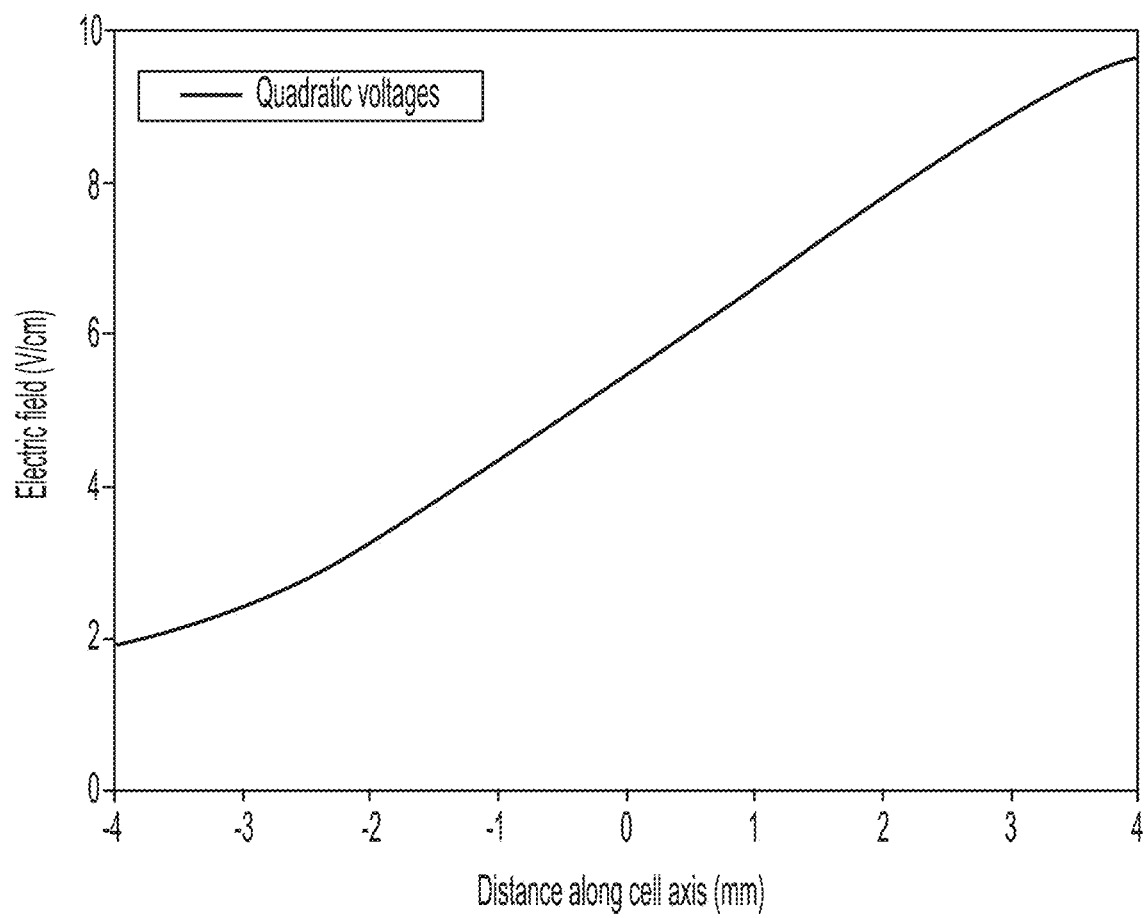
FIG. 3D is a graph of an example gradient for an electric field generated by the simulated vapor cell of FIG. 3B.

FIG. 3D presents a graph of an example gradient for an electric field generated by the simulated vapor cell of FIG. 3B. The gradient is along a direction parallel to the central axis (e.g., a z axis) of the simulated vapor cell and is plotted for the case in which the voltages applied to the electrodes (or electrically conductive layers) have a quadratic relationship. The voltages applied to the electrodes are specifically, 10 V, 9.9 V, 9.6 V, 9.1 V, 8.4 V, 7.5 V, 6.4 V, and 5.1 V in contrast to the voltages listed in FIG. 3A. The selection of voltages generates an approximately linear electric field gradient. There is some deviation from a linear electric field gradient near the edges of the simulated vapor cell (e.g., where the first and second end layers are located) but these deviations can be improved by adjusting the voltages.

Now referring back to FIG. 2A, a method of operating the example vapor cell 200 may include interaction a beam of light with the vapor in the internal cavity 210. In some instances, first and second beams of light may interact with different respective electronic transitions of the vapor. The method also includes applying respective voltages to one or more electrodes (e.g., one or more electrically conductive layers 204a) to alter an electric field in the internal cavity 210. The voltages (or subset thereof) may be varied over time, such as periodically over time. In many instances, respective voltages are applied to all electrodes of the example vapor cell 200. The method additionally includes measuring on or both of an ion signal based on charged particles in the vapor or an optical property of the beam of light after interacting with the vapor.

The ion signal may be readout from the example vapor cell 200 by measuring a voltage difference between the first and second end layers 208a, 208b or an electrical current flowing therebetween. For example, a reference voltage potential may be applied between the first and second end layers 208a, 208b. The ion signal may be determined by measuring a change in the reference voltage potential as charged particles are generated in the vapor and received at one or both of the first and second end layers 208a, 208b. The optical property of the beam of light may be measured using an optical detector that is optically coupled to one of the first and second end layers 208a, 208b. The optical property may include an amplitude of the beam of light, a phase of the beam of light, a polarization of the beam of light, or any combination thereof. The amplitude may be measured at one or more target frequencies of the beam of light.

In many implementations, the internal cavity 210 extends between the first and second end layers 208a, 208b along an axis 226. In these implementations, applying respective voltages to the one or more electrodes may include applying different respective voltages to two or more electrodes to establish a profile in the electric field along the axis 226. The profile may include a constant magnitude of the electric field. The profile may also include a gradient of the electric field or a periodic variation in the electric field. The profile may also vary over time, such as to generate a sequence of predetermined profiles over a time interval. Other types of profiles are possible.

In implementations where the first and second end layers 208a, 208b are electrically conductive layers that define, respectively, first and second end electrodes of the example vapor cell 200, applying respective voltages to one or more electrodes may include displacing a target charged particle in the vapor to one or both of the first and second end layers. The target charged particle may be generated by the beam of light, which in certain cases, can be configured to ionize a portion of the vapor. Such ionization may produce target charged particles have a target characteristic (e.g., ionization state). However, the electric field may also be used to generate charged particles.

For example, applying respective voltages to one or more electrodes may include ionizing, by operation of the electric field, a portion of the vapor to generate charged particles. The electric field may then also be used to displace the charged particles to one or both of the first and second end layers 208a, 208b. In this case, the method may include measuring a charge of individual charged particles incident on one or both of the first and second end layers 208a, 208b. The method may also include measuring an electrical current based on charged particles that are received, over time, at one or both of the first and second end layers 208a, 208b. A time-of-flight of the charged particles may be determined based on a difference in time when the charged particles are generated by operation of the electric field and when the charged particles are received at one or both of the first and second end layers 208a, 208b.

In some implementations, the method includes determining a spectrum of the vapor based on the ion signal, the optical property, or both. In further implementations, the method may include monitoring a characteristic of the spectrum over time and altering at least one applied voltage in response to a change in the characteristic of the spectrum. Examples of the characteristic include a Stark shift and a broadening of the spectrum. In some instances, the at least one applied voltage may be altered, over time, to maintain the characteristic at a target value.

In operation, the example vapor cell 200 may control a magnitude of the electric field along a direction parallel to the axis 226. However, in certain variations, the example vapor cell 200 can also control a magnitude of the electric field along a direction perpendicular to the axis 226 (e.g., a radial direction). To do so, the example vapor cell 200 may include one or more electrically conductive layers 204a that are partitioned into a plurality of sections to define respective segments of a segmented electrode. The plurality of sections may be electrically isolated from each other, such as through a gap or by electrically insulating material. For example, an electrically conductive layer may be partitioned into quadrants, sextants, octants, and so forth having a gap therebetween. The sections may encircle the internal cavity 210 along a plane of the electrically conductive layer and may be of any shape and size. In some instances, the sections are equal sized.

Figure 4A:
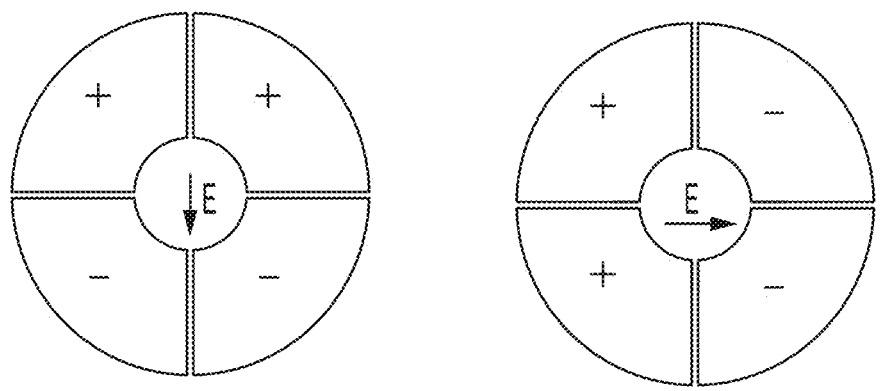
FIG. 4A is a schematic view of an example electrically conductive layer that is partitioned into quadrants to define respective segments of a segmented electrode.

FIG. 4A presents a schematic view of an example electrically conductive layer that is partitioned into quadrant sections to define respective segments of a segmented electrode. Voltages may be applied to each of the four quadrant sections (or segments) to generate an electric field that is in plane with the example electrically conductive layer. The electric field may also be perpendicular to an axis of an internal cavity although non-perpendicular directions (e.g., canted directions) are possible. The left and right sides of FIG. 4A show respective electric fields that are orthogonal to each other.

Figure 4B:
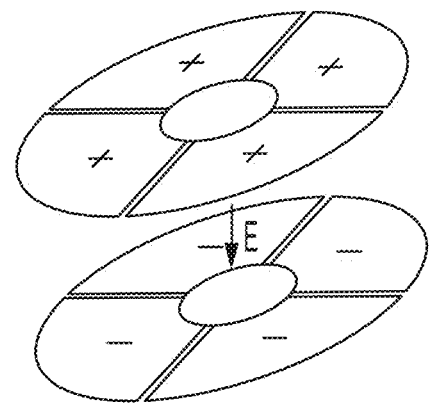
FIG. 4B is a schematic view of two instances of the example electrically conductive layer of FIG. 4A, but in which the instances are separated by a distance along a central axis.

The presence of sections in the one or more electrically conductive layers 204a does not preclude these layers from controlling a magnitude of the electric field along a direction parallel to the axis 226. The same voltage may be applied to all sections (or segments) in an individual electrically conductive layer, thus allowing multiple instances of such layers to generate an electric field parallel to the axis 226. FIG. 4B presents a schematic view of two instances of the example electrically conductive layer of FIG. 4A, but in which the instances are separated by a distance along a central axis (e.g., axis 226). The sections of each instance may be at the same voltage potential to define a common voltage potential for the instance. By holding the two instances at different common voltage potentials, the two instances may generate an electric field along a direction parallel to the central axis.

In many implementations, the contact surfaces 206 of the one or more electrically conductive layers 204a may be partitioned to match the plurality of sections. For example, the contact surface 206 of an electrically conductive layer 204a may be partitioned into a plurality of section contact surfaces. Each section contact surface may then define an electrical contact of a respective one of the segments. In some implementations, the plurality of section contact surfaces are configured such that each is impedance matched to a source of radio frequency electromagnetic radiation.

FIGS. 4A and 4B shows how quadrant electrodes can be used to cancel an electric field. By applying voltages on each of the sections of a stacked set of segmented electrodes, an arbitrary electric field can be cancelled in the region of space that is centered on the axis of the structure (e.g., axis 226) between the plates (e.g., the first and second end layers 208a, 208b). Similar electric field tailoring may be possible with larger numbers of segmented electrodes. The additional segmented electrodes provide added flexibility to tailor electric fields in an internal cavity of a vapor cell. These examples of segmented electrodes can be integrated into the electrode structure of the example vapor cells described herein. Furthermore, stacks of segmented electrodes can be integrated into the vapor cells.

In Rydberg atom-based sensing, there exists some motivation to use high principal quantum number, n, states. The state density may be larger and the transition dipole moments may also be larger. Additionally, the energy separations between dipole coupled Rydberg states can be smaller, which enables the method to be applied to longer wavelength transitions. Unfortunately, the polarizability of the atoms may also increase strongly with n (e.g., proportional to $n^7$).

As a consequence of this large polarizability, the Stark shifts of the atomic energy levels can be large. If the electric fields inside a vapor cell are not controlled (e.g., are inhomogeneous), or if floating charges are present, the electric fields can lead to a broadening of the spectral features used to sense a target electromagnetic field. Such broadening may lead to lower resolution and lower dynamic range for the vapor cell. Uncontrolled electric fields can also lead to field ionization of high n states, which creates additional electric fields and further degradation of vapor cell performance.

The ability to generate large Stark shifts may provide advantages for a vapor cell. In this mode of operation, the electric field in the vapor cell can be controlled to tune the Rydberg atom transitions so that continuous tuning of the vapor cell can be implemented (e.g., via a feedback loop). In order to accomplish this mode of operation without losing sensitivity and traceability, the electric field should be as uniform as possible. Moreover, it is desirable to know the characteristics of the applied electric field (e.g., a position-dependent amplitude). It is possible to modulate the atomic system by applying time dependent voltages to the electrodes, too. Modulation of the atomic energy levels can be used for some signal processing strategies.

Field ionization can be used to readout the Rydberg state populations. Field ionization may, in some cases, be accomplished using an ionization spectrometer and charged particle guide. The stack of layers described above in relation to FIGS. 1A-2 may allow one to construct various types of spectrometers and charged particle guides inside a vapor cell, enabling one to optimize charge readout. Charge readout may be used for gas sensing with Rydberg states.

In addition to enabling a more continuously, tunable sensor, the vapor cells described herein can also help to enable applications for over-the-horizon-radar. In these radar systems, very low frequency waves are used because they can be reflected off the atmosphere, thereby allowing the waves to reach past the horizon. Conventional antennas for radar applications are typically very large because of the large wavelength. Moreover, the size of the receiver antennas limits their spatial distribution and they are often not configured in netted systems despite the increased performance anticipated for a netted arrangement. Since Rydberg atom sensors can be small, and thus do not have the 'size' constraints of traditional antennas, and because the atoms are the sensors, receiver sensors based on the vapor cells described herein can be much smaller in size. The small size of the receiver sensors means that they can be placed more easily in a net that can cooperate to receive the weak return signals. The long wavelengths used for these radar systems mean that low frequency Rydberg transitions have to be used (e.g., high n states). Therefore, control of an electric field within a vapor cell is highly desirable.

As shown in FIGS. 1A-1C and 2, layers of alternating materials can be stacked to form an alternating arrangement of electrically conductive and electrically insulating layers. The electrically conductive layers, which can serve as electrodes, can have voltages applied to them so that they can generate an electric field in an interior cavity of a vapor cell.

Because the stack allows for multiple electrodes, the field control is greater than when electrodes are integrated into the top and bottom windows alone. For the case of arrays or larger combinations of vapor cells, tab structures can extend outward for the stack of layers, and when extending outward from electrically conductive layers, serve as electrode contacts for applying the electric potentials, such as via wires. Applying the voltages to the 'tabs' allows the voltages to be applied to the outer dimension of the array so that the wires used to supply the voltages minimally perturb the sensing performed in the vapor cell array. The electrodes can be ring electrodes or electrodes with different shapes such as a square or round cross-section. Almost any shape is possible. Likewise, the outer cross-section and inner cross-section do not have to be the same. The electrodes can be segmented, such as quadrant, sextant, octant, . . . annular or ring electrodes. The electrodes do not have to alternate either. The density of electrodes can be increased in chosen sections of the vapor cell, such as adjusting a thickness of one or more electrically conductive layers. The electrodes do not have to be uniformly spaced and do not even have to be made of the same materials.

An example of the materials that can be used to construct the laminated vapor cell with electrodes is glass and low resistance silicon. The glass may serves as an insulator and the low resistance silicon as an electrode. It is also possible to use coatings on the glass pieces like indium tin oxide (ITO) and to use high resistivity float-type silicon for the insulating elements. The ITO can be coated with silicon dioxide so that the interface between the layers can be bonded. Moreover, internal surfaces of the ITO coating may also be protected from reaction with alkali atoms in the vapor. Some subset of the body can be coated to make segmented electrodes. Outside the vapor cell the conducting material can be exposed in order to make an electrical connection. Other types of transparent conductive or conductive coatings are possible. The electrodes can also be made from semiconductors. Other materials or fractions of a material are possible.

The laminate construction of the body makes it possible to structure the vapor cell in three-dimensions and eases the manufacturing requirements of the vapor cell. For example, the layers can be cut into two-dimensions from large, high-quality wafers. These two-dimensional slices can then be used as electrodes and the necessary coatings applied before bonding. The body of the cell can be anodically bonded together or bonded in another way, such as by frit bonding, contact bonding, or fusion bonding in an oven (depending on the materials). Individual vapor cells can also have interlocking tabs that can be used for tiling many cells together and for connecting the voltages to the electrodes at the outer regions of an array. The top and bottom windows (or end layers) can be made from a borosilicate glass or an aluminosilicate glass, amongst other possibilities. Moreover, each vapor cell unit can be fiber coupled and the windows can have optical mirrors and filters deposited on them. The stack of layers allows for a flexible design capable of three-dimensional structuring and efficient manufacturing.

In some implementations, the electrodes in the vapor cell define a ring electrode ion guide. This configuration can be used to channel ions from one side of the vapor cell to the other. Ideally, all the ions can be made to travel down the axis of the vapor cell and avoid contact with the walls. Such a configuration can be used for detecting ions created from Rydberg states by collisions or by field ionization by an applied electric field at a subset of or all the electrodes. In some instances, the ions may be selectively created by laser beams passing through the vapor of the vapor cell.

Segmented annular or ring electrodes can be used to control the electric field in three-dimensions. Higher numbers of segments and different electrode shapes can also be used to control the electric field. Radio frequency (RF) fields can be applied using segmented electrodes. The contacts can be impedance matched through the engineering of the electrodes (trace width, for example) to the radio frequency source. RF fields can be used to create ion traps, conveyors and, generally, time dependent potentials for Rydberg atoms and charged particles. Radio frequency fields can also be used to radio frequency or DC field dress interatomic interaction potentials so that Rydberg atom collisions can be manipulated. Furthermore, time dependent fields can be used to modulate the energy levels of the atoms. Spectroscopic signals can be modulated through the detuning of the lasers from resonance by shifting the atomic energy levels with an external field.

Figure 5:
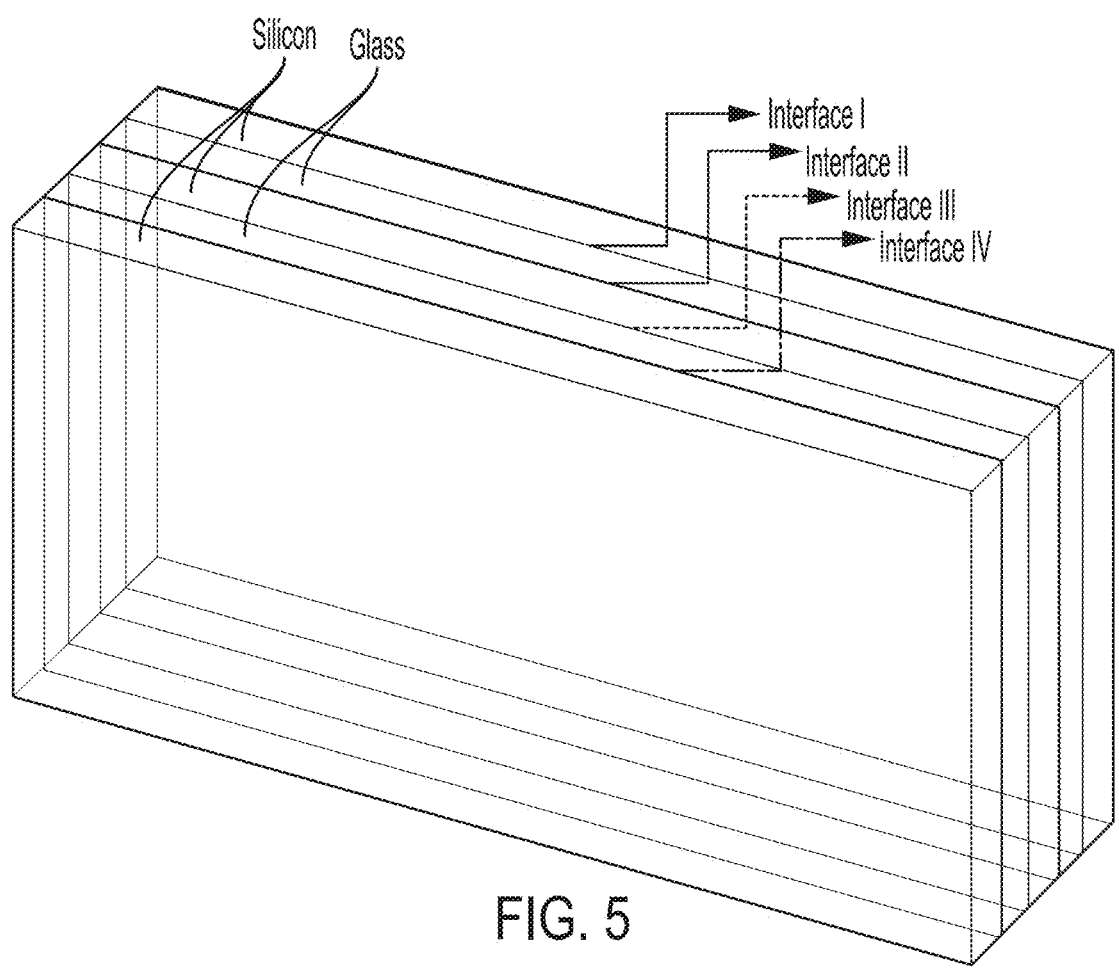
FIG. 5 is a schematic diagram, in perspective view, of a portion of an example stack of layers having an alternating sequence of glass and silicon layers.

To build the stacked vapor cell, an anodic bonding process can be used, as described herein. In particular, a multilayer wafer stack can be bonded or laminated in a single anodic step process with very low perturbation of movable ions in the cell structure. FIG. 5 presents a schematic diagram, in perspective view, of a portion of an example stack of layers having an alternating sequence of glass and silicon layers. Four interfaces are shown between five layers in portion that start and end with silicon layers. Through a sequential hermetic bonding method, a five-layer (Silicon(Si)/Glass (G)/Si/G/Si) and seven-layer (Si/G/Si/G/Si/G/Si) stack of silicon-to-glass sandwiched wafers are anodically bonded together at 370° C. The bonds forming the structures are of high quality and high bonding strength and void-free interfaces. It is also possible to bond each interface one by one but bonding the interfaces in one process can be more efficient. Other types of bonding for the stack are possible such as glass frit bonding, gluing, and contact bonding.

To demonstrate the method, the anodic bonding process was performed using standard double-side polished 1.2 mm thick silicon bare wafers of p-type Si:B<1 0 0> orientation, having a resistivity of 1-15 Ω-cm and a MEMPAX Borofloat glass wafer of 4"±0.005" diameter and 0.043"±0.002" thickness. The average surface microroughness of the glass wafers, $R_a$, is between 0.1 and 0.5 nm, similar to the silicon wafers. The glass wafer has a high ion mobility and matches the coefficient of thermal expansion of silicon well. First, the silicon and glass wafers were cut into about 1 cm×2 cm rectangular-shaped pieces using a dicing saw. After dicing, the silicon and glass substrates were cleaned in a Piranha solution (e.g., a 4:1 aqueous mixture of $H_2SO_4$:$H_2O_2$) for 15 min, followed by a deionized water (DI) rinse. The wafers were dried with pure nitrogen gas ($N_2$) in a cleanroom environment. Before bonding, the silicon and glass substrates were ultrasonically cleaned in DI water followed by solvent cleaning using methanol (e.g., for 20 mins) and acetone (e.g., cleaned twice for 15 mins, maintaining the temperature of the bath at 50° C.). Following the solvent cleaning, the wafers received a DI water rinse, and then were dried with $N_2$ gas. Immediately after drying, the multilayer stack (five-layer or seven-layer structures) were aligned and pre-bonded manually in air at room temperature. The stacks were then sandwiched between a graphite and a stainless-steel plate. The total thickness of the five-layer and seven-layer stacks are 5.6 mm and 7.8 mm, respectively.

To complete the anodic bonding process, the pre-bonded multi-stack wafer layers were placed between two plates (anode and cathode) which were connected to the DC power supply. The bonding process parameters were carefully chosen based on preliminary optimization tests at various voltages and temperatures. For triple-stack layers, Si/G/Si and G/Si/G, a primary and secondary bonding method was optimized (e.g., polarity inversion). The resulting bond strengths were 15 MPa and 10 MPa respectively, as measured by using an adhesion tester. During the anodic bonding process, the bottom Si layer and the top Si layer were connected to the positive and negative electrodes. The stacked wafers were heated to 370° C. to increase the mobility of the positive ions in the glass substrates. The temperature was then slowly ramped up in steps of 75° C. to avoid the residual stress and unwanted wafer curvature of the pre-bonded wafer layers. The final temperature was maintained at 370° C. for at least 20 mins to ensure temperature uniformity before applying the high voltage. When the temperature was stabilized, a DC voltage was applied to the electrodes and the current was measured as a function of the bonding time. The anodic bonding process was completed when the current decayed to a residual value (e.g., in the 3 layer case to 0.008 mA). After the primary bonding was completed, the power supply was switched off and the temperature was maintained at 370° C. After the completion of the bonding, the polarity of the DC power supply was switched (secondary bonding process). A similar current was observed at completion of the secondary bonding process. The anodic bonding process conditions, parameters, and the images of the bonded multi-layer stacked wafers are shown in table of FIG. 6.

Figure 7:
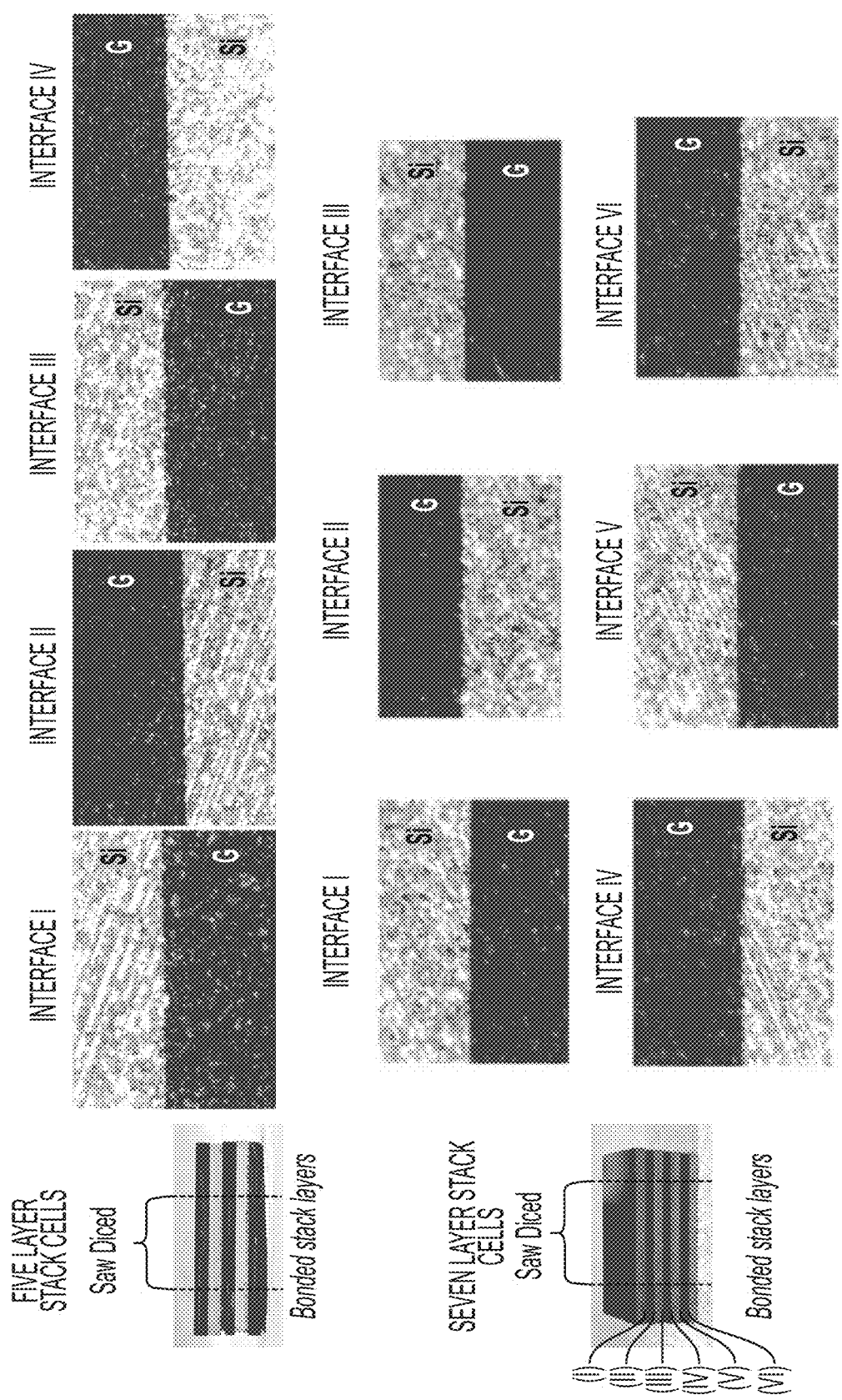
FIG. 7 shows images of two example layer stacks, including interfaces therein, in which alternating layers of silicon (Si) and glass (G) are bonded to each other.

The bonding strength of the wafers was measured by using the crack-opening test (Razorblade test), and/or dicing, cleaving, and so forth. Both the five and seven-layer stacks were investigated using the crack opening test. When a stainless-steel razor blade of a thickness of 0.2 mm was inserted into the bond interface of glass and silicon, the razor blade tip bent on its own, showing that the bonding interface was very strong. Both bonded substrates were also subjected to a diamond saw wafer dicing test (specimen size of 1 cm×1 cm) to evaluate the interface. No cracks, debonding, fractures, or defects were observed. This result shows that the bond strength is large enough for the fabrication of multi-layer hermetically sealed vapor cells as in relation to FIGS. 1A-2. FIG. 7 shows cross-sectional views of the bonded substrates (five and seven-layer stacks) and their interface quality using an optical microscope. The bonded substrates are formed by anodically bonding alternating layers of silicon (Si) and glass (G) to each other, such as by the bonding process described in relation to FIG. 6. All bonded interface regions appear smooth as-cut and were not subjected to polishing. Results show that there are no bond voids (defects, cracks, debonding) along with the bond interfaces, implying superior bonding quality.

To make segmented electrodes, a shadow mask may be used with glass wafers to deposit a metal like chromium or gold (e.g., via as sputtering). After the chromium or gold is on a wafer, the wafer can be coated with silicon dioxide using method like plasma enhanced chemical vapor deposition (PECVD). The wafer may not be flat at this point due to the buried electrode structure but it can be polished to a suitable surface roughness using chemical mechanical polishing (CMP). Almost any electrode pattern can be designed in this way. Other deposition and patterning methods are possible.

The vapor cells can be loaded with pure Cs inside the vapor cell or a cavity inside the vapor cell wall, connected to the cavity via a hole or trench structure. The vapor cells can also be loaded using a getter and activated with a laser. Other filling methods can also be used (e.g., paraffin coated alkali metal).

In some aspects of what is described, a vapor cell may be described by the following examples:

Example 1. A vapor cell, comprising:
  a body defined by a stack of layers that comprises electrically conductive layers and electrically insulating layers, the stack of layers bonded to each other and having:
    first and second end layers at respective opposite ends of the body, one or both of the first and second end layers being optically transparent, and
    intermediate layers between the first and second end layers that define an internal cavity of the body, the internal cavity extending through the body between the first and second end layers,
    wherein adjacent electrically conductive layers are separated by at least one electrically insulating layer, and
    wherein each electrically conductive layer defines an electrode of the vapor cell and comprises a contact surface on an exterior side of the body, the contact surface defining an electrical contact of the electrode; and
  a vapor or a source of the vapor disposed in the internal cavity.

Example 2. The vapor cell of example 1, wherein at least a portion of the stack of layers alternates between electrically conductive and electrically insulating layers.

Example 3. The vapor cell of example 2, wherein the entire stack of layers alternates between electrically conductive and electrically insulating layers.

Example 4. The vapor cell of example 1 or any one of examples 2-3, wherein the first and second end layers are electrically conductive layers and define, respectively, first and second end electrodes of the vapor cell.

Example 5. The vapor cell of example 1 or any one of examples 2-4,
  wherein each intermediate layer comprises an inner perimeter surface that defines part of the internal cavity; and
  wherein the inner perimeter surface of at least one electrically conductive layer is configured to allow the electrically conductive layer to protrude into the internal cavity past layers in the stack that are adjacent the electrically conductive layer.

Example 6. The vapor cell of example 1 or any one of examples 2-5,
  wherein each intermediate layer comprises an outer perimeter surface that defines part of the exterior side of the body; and
  wherein the outer perimeter surface of at least one electrically conductive layer is configured to allow the electrically conductive layer to protrude from the exterior side past layers in the stack that are adjacent the electrically conductive layer.

Example 7. The vapor cell of example 1 or any one of examples 2-6,
  wherein at least one electrically conductive layer is partitioned into a plurality of sections to define respective segments of a segmented electrode; and
  wherein the contact surface of the at least one electrically conductive layer is partitioned into a plurality of section contact surfaces, each section contact surface defining an electrical contact of a respective one of the segments.

Example 8. The vapor cell of example 7, wherein the plurality of sections are electrically isolated from each other.

Example 9. The vapor cell of example 7 or example 8, wherein the plurality of section contact surfaces are configured such that each is impedance matched to a source of radio frequency electromagnetic radiation.

Example 10. The vapor cell of example 1 or any one of examples 2-9, wherein one or more layers in the stack are planar layers.

Example 11. The vapor cell of example 1 or any one of examples 2-10, wherein at least one electrically conductive layer comprises:
- a substrate; and
- an electrically conductive coating that covers at least part of the substrate and has a first portion exposed to the interior cavity and a second portion defining the contact surface of the electrically conductive layer.

Example 12. The vapor cell of example 11, wherein the substrate is formed of an electrically insulating material.

Example 13. The vapor cell of example 11 or example 12, wherein the at least one electrically conductive layer further comprises:
- an electrically insulating coating disposed over the electrically conductive coating and covering at least the first portion thereof.

Example 14. The vapor cell of example 1 or any one of examples 2-13,
- wherein the stack of layers comprises one or more internal surfaces that bound the internal cavity; and
- wherein at least a portion of the one or more internal surfaces are covered by a coating that is chemically inert to the vapor.

Example 15. The vapor cell of example 14, wherein the portion of the one or more internal surfaces comprises all internal surfaces associated with the electrically conductive layers.

Example 16. The vapor cell of example 1 or any one of examples 2-15,
- wherein the vapor cell comprises the source of the vapor;
- wherein the intermediate layers define a wall encircling a first portion of the internal cavity; and
- wherein the internal cavity comprises a second portion that extends into the wall from the first portion and contains the source of the vapor.

Example 17. The vapor cell of example 1 or any one of examples 2-16,
- wherein the body comprises a first exterior side and a second exterior side;
- wherein at least one electrically conductive layer comprises first and second tabs extending outward from, respectively, the first and second exterior sides; and
- wherein one or both of the first and second tabs define the contact surface of the electrically conductive layer.

Example 18. The vapor cell of example 1 or any one of examples 2-17, wherein the electrically conductive layers are formed of a material having a resistivity less than $10^3$ $\Omega$-cm.

Example 19. The vapor cell of example 1 or any one of examples 2-18, wherein at least one electrically conductive layer is formed of doped silicon.

Example 20. The vapor cell of example 1 or any one of examples 2-19, wherein at least one electrically conductive layer is formed of a transparent semiconducting oxide.

Example 21. The vapor cell of example 1 or any one of examples 2-20, wherein at least one electrically conductive layer is formed of a metal or metal alloy.

Example 22. The vapor cell of example 1 or any one of examples 2-21, wherein the electrically insulating layers are formed of a material having a resistivity greater than $10^6$ $\Omega$-cm.

Example 23. The vapor cell of example 1 or any one of examples 2-22, wherein at least one electrically insulating layer is formed of a glass comprising silicon oxide.

Example 24. The vapor cell of example 1 or any one of examples 2-23, wherein the stack of layers comprises an adhesion layer at an interface between a pair of adjacent layers in the stack.

Example 25. The vapor cell of example 1 or any one of examples 2-24, wherein one or both of the first and second end layers comprise a reflective coating.

Example 26. The vapor cell of example 1 or any one of examples 2-25, wherein one or both of the first and second end layers comprise an anti-reflective coating.

Example 27. The vapor cell of example 1 or any one of examples 2-26,
- wherein the stack of layers comprises one or more internal surfaces that bound the internal cavity; and
- wherein the one or more internal surfaces are covered, at least in part, by an anti-relaxation coating.

Example 28. The vapor cell of example 27, wherein the anti-relaxation coating comprises a hydrocarbon material.

Example 29. The vapor cell of example 1 or any one of examples 2-28, wherein one or both of the first and second end layers comprises an interior surface covering an opening of the internal cavity adjacent the end layer, the interior surface having an optical filter coating disposed thereon.

Example 30. The vapor cell of example 1 or any one of examples 2-30, wherein the vapor comprises a gas of Rydberg atoms.

In some aspects of what is described, a method of operating a vapor cell may be described by the following examples:

Example 1. A method, comprising:
- interacting a beam of light with a vapor in a vapor cell, the vapor cell comprising:
  - a body defined by a stack of layers comprising electrically conductive layers and electrically insulating layers, the stack of layers bonded to each other and having:
    - first and second end layers at respective opposite ends of the body, one or both of the first and second end layers being optically transparent, and intermediate layers between the first and second end layers that define an internal cavity of the body, the internal cavity extending through the body between the first and second end layers,
    - wherein adjacent electrically conductive layers are separated by at least one electrically insulating layer, and
    - wherein each electrically conductive layer defines an electrode of the vapor cell and comprises a contact surface on an exterior side of the body, the contact surface defining an electrical contact of the electrode, and
  - the vapor, disposed in the internal cavity; and
- applying respective voltages to one or more electrodes to alter an electric field in the internal cavity; and
- measuring one or both of:
  - an ion signal based on charged particles in the vapor, and
  - an optical property of the beam of light after interacting with the vapor.

Example 2. The method of example 1, wherein respective voltages are applied to all of the electrodes of the vapor cell.

Example 3. The method of example 1 or example 2, wherein applying respective voltages to one or more electrodes comprises varying at least one applied voltage over time.

Example 4. The method of example 3, wherein the at least one applied voltage varies periodically over time.

Example 5. The method of example 1 or any one of examples 2-4, wherein the first and second end layers are electrically conductive layers and define, respectively, first and second end electrodes of the vapor cell.

Example 6. The method of example 5, wherein applying respective voltages to one or more electrodes comprises displacing a target charged particle in the vapor to one or both of the first and second end layers.

Example 7. The method of example 6, wherein interacting a beam of light with a vapor comprises ionizing, by operation of a beam of light, a portion of the vapor to generate the target charged particle.

Example 8. The method of example 5, wherein applying respective voltages to one or more electrodes comprises:
ionizing, by operation of the electric field, a portion of the vapor to generate charged particles; and
displacing, by operation of the electric field, the charged particles to one or both of the first and second end layers.

Example 9. The method of example 8, comprising:
measuring a charge of individual charged particles incident on one or both of the first and second end layers.

Example 10. The method of example 8 or example 9, comprising:
measuring an electrical current based on charged particles that are received, over time, at one or both of the first and second end layers.

Example 11. The method of example 8 or any one of examples 9-10, comprising:
determining a time-of-flight of the charged particles based on a difference in time when the charged particles are generated by operation of the electric field and when the charged particles are received at one or both of the first and second end layers.

Example 12. The method of example 1 or any one of examples 2-11,
wherein the internal cavity extends between the first and second end layers along an axis; and
wherein applying respective voltages to the one or more electrodes comprises applying different respective voltages to two or more electrodes to establish a profile in the electric field along the axis.

Example 13. The method of example 12, wherein the profile comprises a constant magnitude of the electric field.

Example 14. The method of example 12 or example 13, wherein the profile comprises a gradient of the electric field.

Example 15. The method of example 12 or any one of examples 13-14, wherein the profile comprises a periodic variation in the electric field.

Example 16. The method of example 1 or any one of examples 2-15,
wherein at least one electrically conductive layer is partitioned into a plurality of sections to define respective segments of a segmented electrode;
wherein the contact surface of the at least one electrically conductive layer is partitioned into a plurality of section contact surfaces, each section contact surface defining an electrical contact of a respective one of the segments; and wherein applying respective voltages to the one or more electrodes comprises applying respective voltages to one or more segments.

Example 17. The method of example 16,
wherein the internal cavity extends between the first and second end layers along an axis; and
wherein applying respective voltages to one or more segments comprises applying different respective voltages to two or more segments to alter the electric field along a direction non-parallel to the axis.

Example 18. The method of example 1 or any one of examples 2-17, wherein interacting a beam of light comprises passing the beam of light through the first end layer, the internal cavity, and second end layer.

Example 19. The method of example 1 or any one of examples 2-17, wherein interacting a beam of light comprises:
passing the beam of light through the first end layer and the internal cavity; and
reflecting the beam of light off the second end layer and back through internal cavity and the first end layer.

Example 20. The method of example 1 or any one of examples 2-19, wherein the optical property comprises an amplitude of the beam of light.

Example 21. The method of example 21, wherein the amplitude is measured at one or more target frequencies of the beam of light.

Example 22. The method of example 1 or any one of examples 2-21, wherein the optical property comprises a phase of the beam of light.

Example 23. The method of example 1 or any one of examples 2-22, wherein the optical property comprises a polarization of the beam of light.

Example 24. The method of example 1 or any one of examples 2-23, comprising:
determining a spectrum of the vapor based on the ion signal, the optical property, or both.

Example 25. The method of example 24, comprising:
monitoring a characteristic of the spectrum over time; and
altering at least one applied voltage in response to a change in the characteristic of the spectrum.

Example 26. The method of example 25, wherein the at least one applied voltage is altered, over time, to maintain the characteristic at a target value.

Example 27. The method of example 25, wherein the characteristic is a Stark shift.

Example 28. The method of example 25, wherein the characteristic is a broadening of the spectrum.

Example 29. The method of example 1 or any one of examples 2-28, wherein the vapor comprises a gas of Rydberg atoms.

Example 30. The method of example 1 or any one of examples 2-29, wherein interacting a beam of light with a vapor comprises interacting first and second beams of light with different respective electronic transitions of the vapor.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A method, comprising:
   interacting a beam of light with a vapor in a vapor cell, the vapor cell comprising:
   a body defined by a stack of layers comprising electrically conductive layers and electrically insulating layers, the stack of layers bonded to each other and having:
   first and second end layers at respective opposite ends of the body, one or both of the first and second end layers being optically transparent,
   intermediate layers between the first and second end layers that define an internal cavity of the body, the internal cavity extending through the body between the first and second end layers, and
   one or more internal surfaces that bound the internal cavity, at least a portion of the one or more internal surfaces covered by a coating that is chemically inert to the vapor,
   wherein adjacent electrically conductive layers are separated by at least one electrically insulating layer, and
   wherein each electrically conductive layer defines an electrode of the vapor cell and comprises a contact surface on an exterior side of the body, the contact surface defining an electrical contact of the electrode, and
   the vapor, disposed in the internal cavity; and
   applying respective voltages to one or more electrodes to alter an electric field in the internal cavity; and
   measuring one or both of:
   an ion signal based on charged particles in the vapor, and
   an optical property of the beam of light after interacting with the vapor.

2. The method of claim 1, wherein respective voltages are applied to all of the electrodes of the vapor cell.

3. The method of claim 1, wherein applying respective voltages to one or more electrodes comprises varying at least one applied voltage over time.

4. The method of claim 3, wherein the at least one applied voltage varies periodically over time.

5. The method of claim 1, wherein the first and second end layers are electrically conductive layers and define, respectively, first and second end electrodes of the vapor cell.

6. The method of claim 5, wherein applying respective voltages to one or more electrodes comprises displacing a target charged particle in the vapor to one or both of the first and second end layers.

7. The method of claim 6, wherein interacting a beam of light with a vapor comprises ionizing, by operation of a beam of light, a portion of the vapor to generate the target charged particle.

8. The method of claim 5, wherein applying respective voltages to one or more electrodes comprises:
   ionizing, by operation of the electric field, a portion of the vapor to generate charged particles; and
   displacing, by operation of the electric field, the charged particles to one or both of the first and second end layers.

9. The method of claim 8, comprising:
   measuring a charge of individual charged particles incident on one or both of the first and second end layers.

10. The method of claim 8, comprising:
    measuring an electrical current based on charged particles that are received, over time, at one or both of the first and second end layers.

11. The method of claim 8, comprising:
    determining a time-of-flight of the charged particles based on a difference in time when the charged particles are generated by operation of the electric field and when the charged particles are received at one or both of the first and second end layers.

12. The method of claim 1,
    wherein the internal cavity extends between the first and second end layers along an axis; and
    wherein applying respective voltages to the one or more electrodes comprises applying different respective voltages to two or more electrodes to establish a profile in the electric field along the axis.

13. The method of claim 12, wherein the profile comprises a constant magnitude of the electric field.

14. The method of claim 12, wherein the profile comprises a gradient of the electric field.

15. The method of claim 12, wherein the profile comprises a periodic variation in the electric field.

16. The method of claim 1,
    wherein at least one electrically conductive layer is partitioned into a plurality of sections to define respective segments of a segmented electrode;
    wherein the contact surface of the at least one electrically conductive layer is partitioned into a plurality of section contact surfaces, each section contact surface defining an electrical contact of a respective one of the segments; and
    wherein applying respective voltages to the one or more electrodes comprises applying respective voltages to one or more segments.

17. The method of claim 16,
    wherein the internal cavity extends between the first and second end layers along an axis; and
    wherein applying respective voltages to one or more segments comprises applying different respective voltages to two or more segments to alter the electric field along a direction non-parallel to the axis.

18. The method of claim 1, wherein interacting a beam of light comprises passing the beam of light through the first end layer, the internal cavity, and second end layer.

19. The method of claim 1, wherein interacting a beam of light comprises:
    passing the beam of light through the first end layer and the internal cavity; and
    reflecting the beam of light off the second end layer and back through internal cavity and the first end layer.

20. The method of claim 1, wherein the optical property comprises an amplitude of the beam of light.

21. The method of claim 20, wherein the amplitude is measured at one or more target frequencies of the beam of light.

22. The method of claim 1, wherein the optical property comprises a phase of the beam of light.

23. The method of claim 1, wherein the optical property comprises a polarization of the beam of light.

24. The method of claim 1, comprising:
determining a spectrum of the vapor based on the ion signal, the optical property, or both.

25. The method of claim 24, comprising:
monitoring a characteristic of the spectrum over time; and
altering at least one applied voltage in response to a change in the characteristic of the spectrum.

26. The method of claim 25, wherein the at least one applied voltage is altered, over time, to maintain the characteristic at a target value.

27. The method of claim 25, wherein the characteristic is a Stark shift.

28. The method of claim 25, wherein the characteristic is a broadening of the spectrum.

29. The method of claim 1, wherein the vapor comprises a gas of Rydberg atoms.

30. The method of claim 1, wherein interacting a beam of light with a vapor comprises interacting first and second beams of light with different respective electronic transitions of the vapor.

* * * * *

UNITED STATES PATENT AND TRADEMARK OFFICE
CERTIFICATE OF CORRECTION

PATENT NO. : 11,885,842 B1
APPLICATION NO. : 17/943796
DATED : January 30, 2024
INVENTOR(S) : Pandiyan et al.

It is certified that error appears in the above-identified patent and that said Letters Patent is hereby corrected as shown below:

On the Title Page

Page 2, Column 1, under item (56), Line 1 Delete "Mar. 23," and insert -- Mar. 28, -- therefor Page 2, Column 2, under item (56), Line 15 Delete "SiO2" and insert -- $SiO_2$ -- therefor In the Specification Column 6, Line 66 Delete "204*a*" and insert -- 204*b* -- therefor Column 7, Line 29 Delete "204*b*" and insert -- 204*a* -- therefor Column 9, Line 41 Delete "frustrum," and insert -- frustum, -- therefor Column 10, Line 24 Delete "210." and insert -- 200. -- therefor Column 11, Line 14 Delete "8)." and insert -- ®). -- therefor Column 12, Line 40 Delete "208*a*" and insert -- 208*b* -- therefor Column 12, Line 64 Delete "222" and insert -- 224 -- therefor Signed and Sealed this
Ninth Day of April, 2024

Katherine Kelly Vidal
*Director of the United States Patent and Trademark Office*